(12) United States Patent
Su et al.

(10) Patent No.: US 11,563,013 B2
(45) Date of Patent: Jan. 24, 2023

(54) MEMORY DEVICE AND METHOD FOR FORMING THE SAME

(71) Applicant: TAIWAN SEMICONDUCTOR MANUFACTURING CO., LTD., Hsinchu (TW)

(72) Inventors: Hsin-Wen Su, Yunlin County (TW); Chih-Chuan Yang, Tainan (TW); Shih-Hao Lin, Hsinchu (TW); Yu-Kuan Lin, Taipei (TW); Lien-Jung Hung, Taipei (TW); Ping-Wei Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 44 days.

(21) Appl. No.: 17/035,371

(22) Filed: Sep. 28, 2020

(65) Prior Publication Data
US 2022/0102359 A1  Mar. 31, 2022

(51) Int. Cl.
| H01L 21/8234 | (2006.01) |
| H01L 21/768 | (2006.01) |
| H01L 27/11 | (2006.01) |
| H01L 27/092 | (2006.01) |
| H01L 21/8238 | (2006.01) |
| H01L 29/66 | (2006.01) |

(52) U.S. Cl.
CPC .. *H01L 27/1104* (2013.01); *H01L 21/823821* (2013.01); *H01L 21/823828* (2013.01); *H01L 21/823864* (2013.01); *H01L 27/0924* (2013.01); *H01L 27/0928* (2013.01); *H01L 29/6653* (2013.01); *H01L 29/66545* (2013.01)

(58) Field of Classification Search
None
See application file for complete search history.

(56) References Cited

U.S. PATENT DOCUMENTS

2019/0333915 A1* 10/2019 Lee ................. H01L 21/823475

* cited by examiner

*Primary Examiner* — Joseph C. Nicely
*Assistant Examiner* — Lamont B Koo
(74) *Attorney, Agent, or Firm* — Birch, Stewart, Kolasch & Birch, LLP

(57) ABSTRACT

A memory device includes a substrate, first semiconductor fin, second semiconductor fin, first gate structure, second gate structure, first gate spacer, and a second gate spacer. The first gate structure crosses the first semiconductor fin. The second gate structure crosses the second semiconductor fin, the first gate structure extending continuously from the second gate structure, in which in a top view of the memory device, a width of the first gate structure is greater than a width of the second gate structure. The first gate spacer is on a sidewall of the first gate structure. The second gate spacer extends continuously from the first gate spacer and on a sidewall of the second gate structure, in which in the top view of the memory device, a width of the first gate spacer is less than a width of the second gate spacer.

20 Claims, 35 Drawing Sheets

US 11,563,013 B2

MEMORY DEVICE AND METHOD FOR FORMING THE SAME

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A FinFET includes an extended semiconductor fin that is elevated above a substrate in a direction normal to the plane of the substrate. The channel of the FET is formed in this vertical fin. A gate is provided over (e.g., wrapping) the fin. The FinFETs further can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
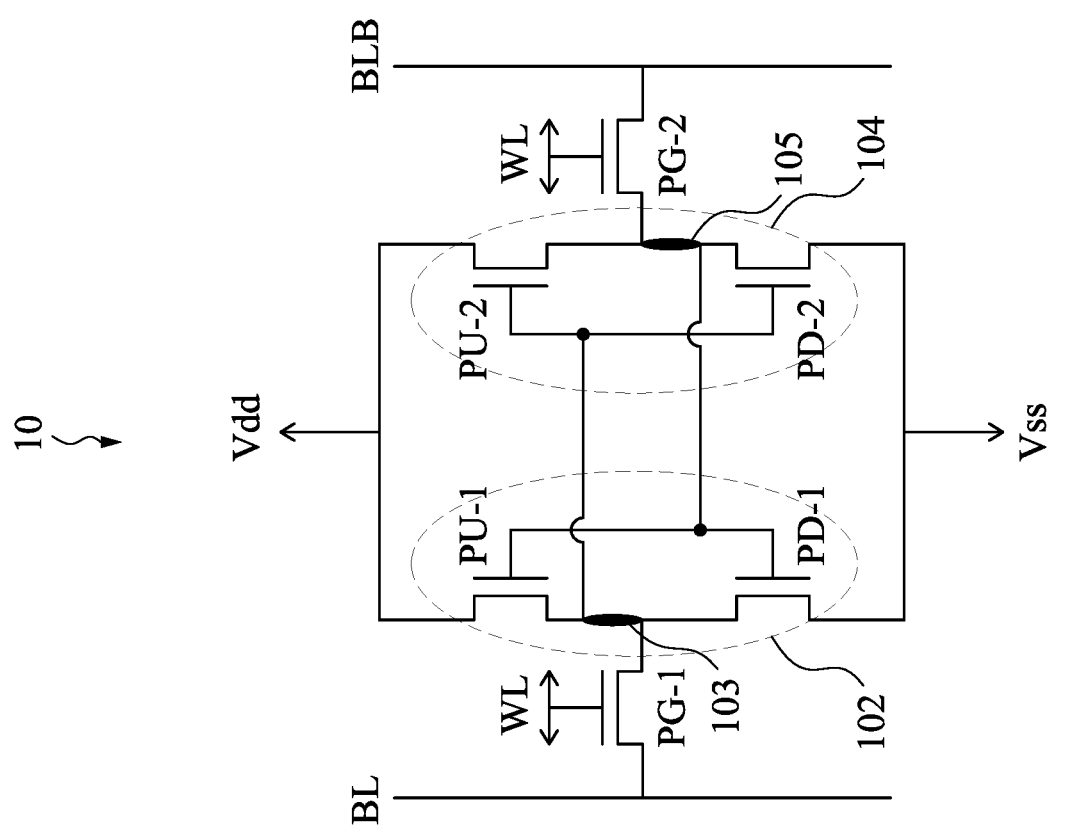
FIG. 1 is a circuit diagram of a six transistor (6T) SRAM cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present disclosure will be described with respect to embodiments, a static random-access memory (SRAM) formed of fin field effect transistors (FinFETs). The embodiments of the disclosure may also be applied, however, to a variety of integrated circuits. Various embodiments will be explained in detail with reference to the accompanying drawings.

Static random-access memory (SRAM) is a type of volatile semiconductor memory that uses bistable latching circuitry to store each bit. Each bit in an SRAM is stored on four transistors (PU-1, PU-2, PD-1, and PD-2) that form two cross-coupled inverters. This SRAM cell has two stable states which are used to denote 0 and 1. Two additional access transistors (PG-1 and PG-2) serve to control the access to a storage cell during read and write operations.

FIG. 1 is a circuit diagram of a six transistor (6T) SRAM cell. The SRAM cell 10 includes a first inverter 102 formed by a pull-up transistor PU-1 and a pull-down transistor PD-1. The SRAM cell 10 further includes a second inverter 104 formed by a pull-up transistor PU-2 and a pull-down transistor PD-2. Furthermore, both the first inverter 102 and second inverter 104 are coupled between a voltage bus Vdd and a ground potential Vss. In some embodiments, the pull-up transistor PU-1 and PU-2 can be p-type metal oxide semiconductor (PMOS) transistors while the pull-down transistors PD-1 and PD-2 can be n-type metal oxide semiconductor (NMOS) transistors, and the claimed scope of the present disclosure is not limited in this respect.

In FIG. 1, the first inverter 102 and the second inverter 104 are cross-coupled. That is, the first inverter 102 has an input connected to the output of the second inverter 104. Likewise, the second inverter 104 has an input connected to the output of the first inverter 102. The output of the first inverter 102 is referred to as a storage node 103. Likewise, the output of the second inverter 104 is referred to as a storage node 105. In a normal operating mode, the storage node 103 is in the opposite logic state as the storage node 105. By employing the two cross-coupled inverters, the SRAM cell 10 can hold the data using a latched structure so that the stored data will not be lost without applying a refresh cycle as long as power is supplied through Vdd.

In an SRAM device using the 6T SRAM cells, the cells are arranged in rows and columns. The columns of the SRAM array are formed by a bit line pairs, namely a first bit line BL and a second bit line BLB. The cells of the SRAM device are disposed between the respective bit line pairs. As shown in FIG. 1, the SRAM cell 10 is placed between the bit line BL and the bit line BLB.

In FIG. 1, the SRAM cell 10 further includes a first pass-gate transistor PG-1 connected between the bit line BL and the output 103 of the first inverter 102. The SRAM cell 10 further includes a second pass-gate transistor PG-2 connected between the bit line BLB and the output 105 of the second inverter 104. The gates of the first pass-gate transistor PG-1 and the second pass-gate transistor PG-2 are connected to a word line WL, which connects SRAM cells in a row of the SRAM array.

In operation, if the pass-gate transistors PG-1 and PG-2 are inactive, the SRAM cell 10 will maintain the complementary values at storage nodes 103 and 105 indefinitely as long as power is provided through Vdd. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

In the circuit diagram of FIG. 1, the pull-up transistors PU-1, PU-2 are p-type transistors. The pull-down transistors PD-1, PD-2, and the pass-gate transistors PG-1, PG-2 are n-type transistors. According to various embodiments, the pull-up transistors PU-1, PU-2, the pull-down transistors PD-1, PD-2, and the pass-gate transistors PG-1, PG-2 can be implemented by FinFETs.

The structure of the SRAM cell 10 in FIG. 1 is described in the context of the 6T-SRAM. One of ordinary skill in the art, however, should understand that features of the various embodiments described herein may be used for forming other types of devices, such as an 8T-SRAM memory device, or memory devices other than SRAMs. Furthermore, embodiments of the present disclosure may be used as stand-alone memory devices, memory devices integrated with other integrated circuitry, or the like. Accordingly, the embodiments discussed herein are illustrative of ways to make and use the disclosure, and do not limit the scope of the disclosure.

Figure 2A:
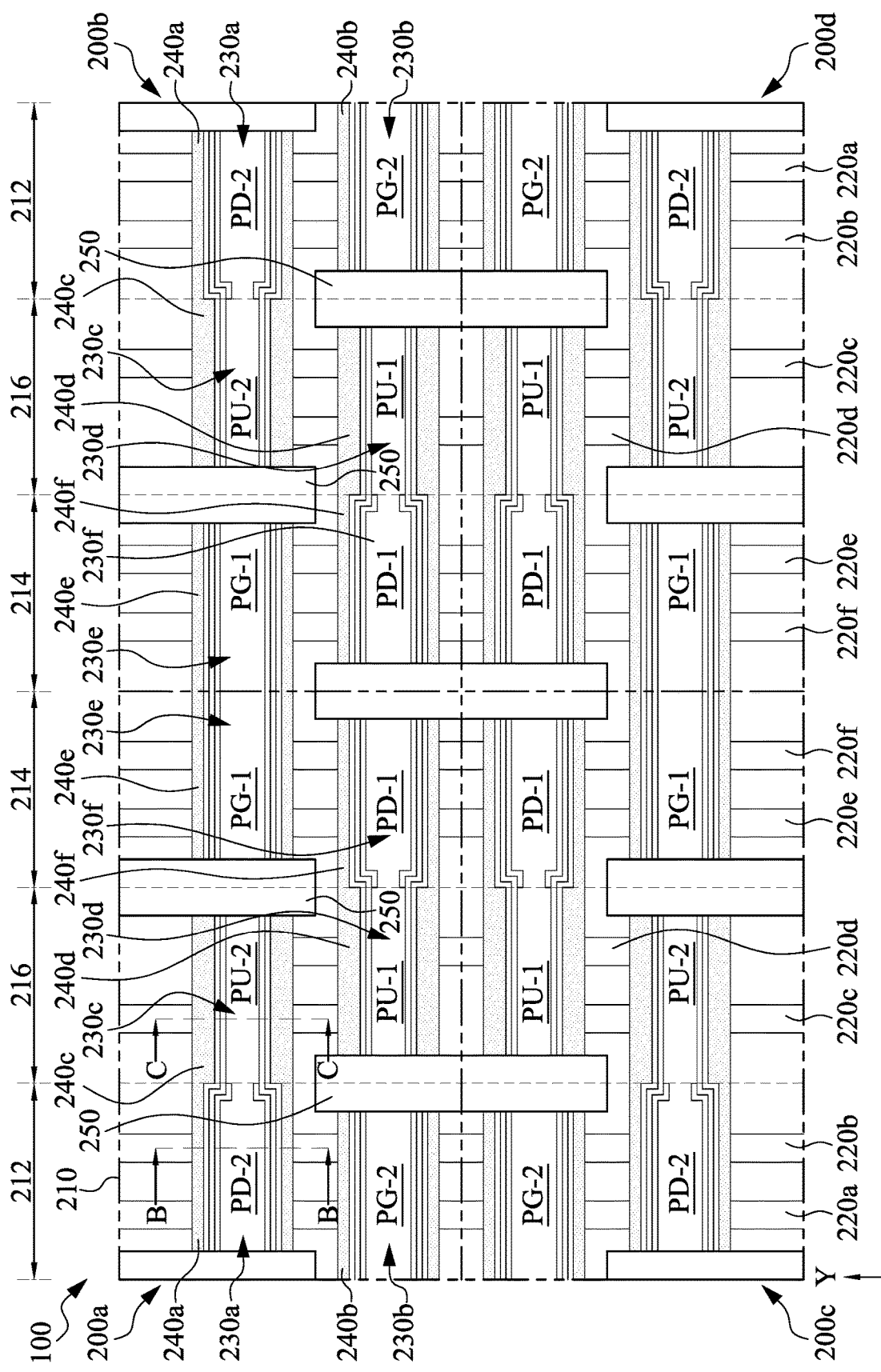
FIG. 2A is a top view of a memory device in accordance with some embodiments of the present disclosure.
Figure 2C:
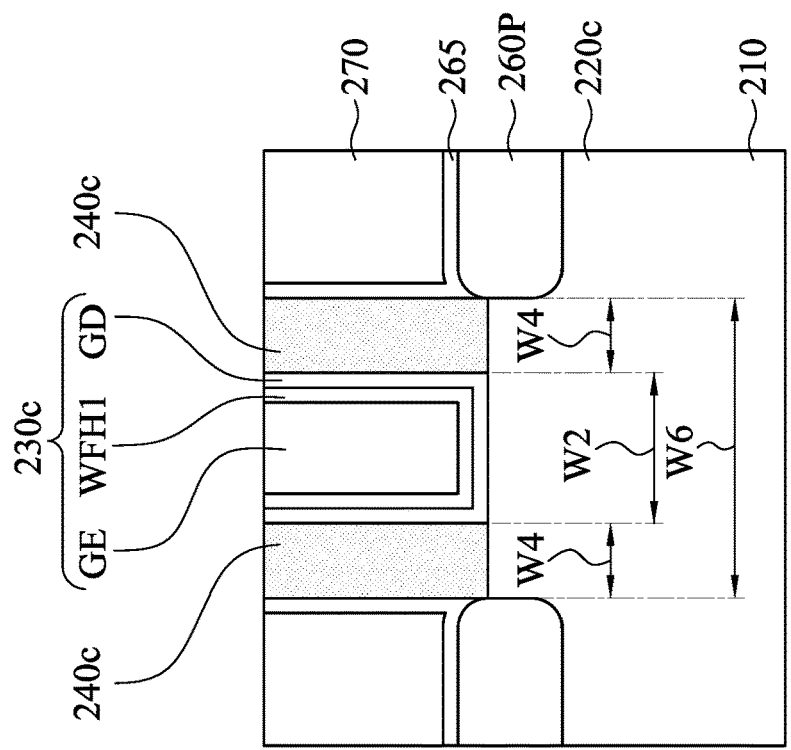
FIG. 2C is a cross-sectional view of FIG. 2A.
Figure 2B:
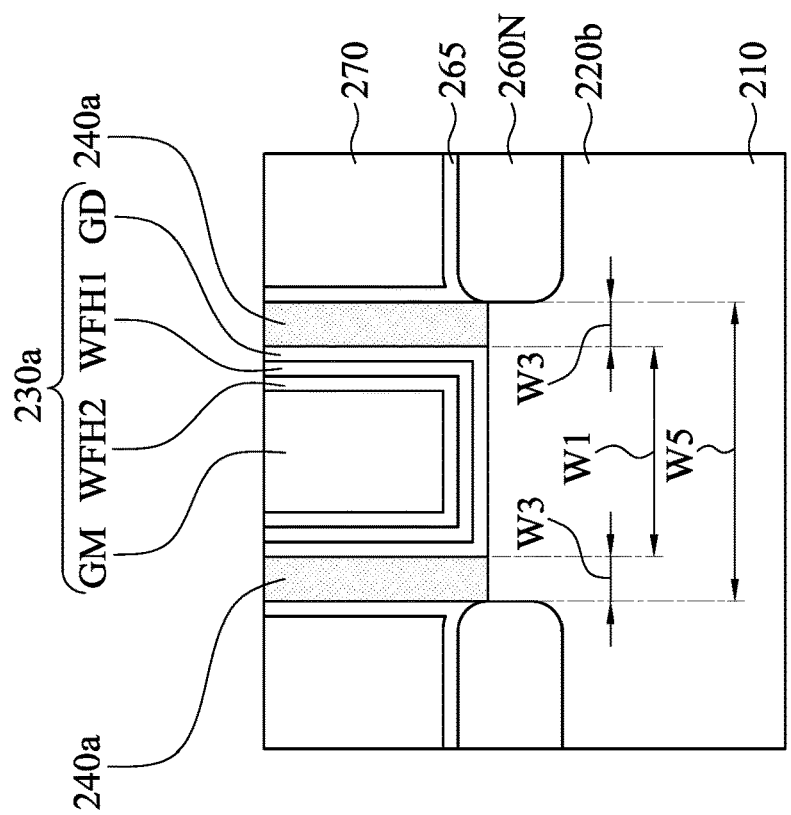
FIG. 2B is a cross-sectional view of FIG. 2A.
Figure 2D:
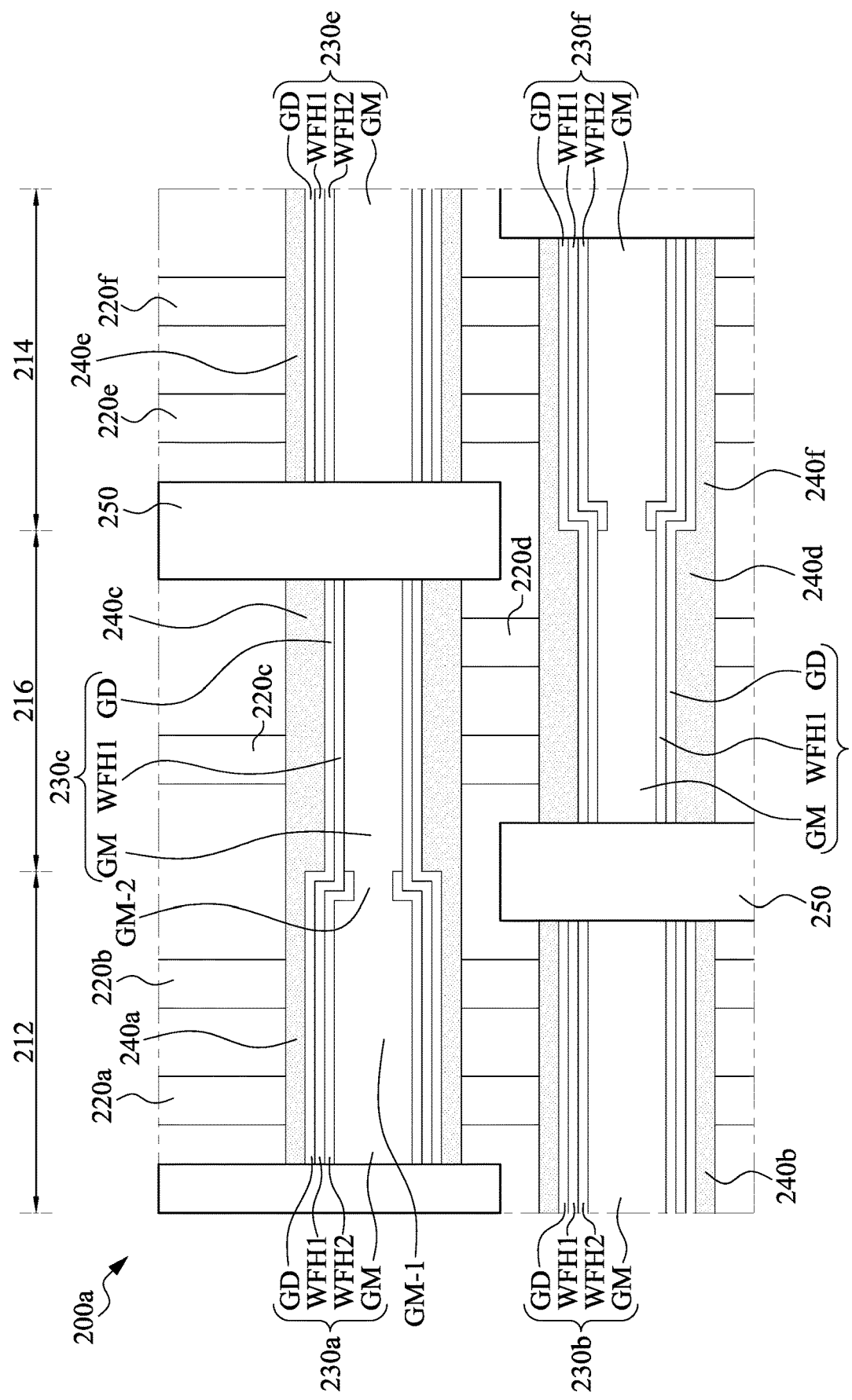
FIG. 2D is an enlarged view of FIG. 2A.

Reference is made to FIGS. 2A to 2D. FIG. 2A is a top view of a memory device in accordance with some embodiments of the present disclosure. FIG. 2B is a cross-sectional view along line B-B of FIG. 2A. FIG. 2C is a cross-sectional view along line C-C of FIG. 2A. FIG. 2D is an enlarged view of FIG. 2A. In FIG. 2A, the integrated circuit is an SRAM device 100 including four memory cells 200a, 200b, 200c, and 200d. In some other embodiments, however, the number of the memory cells 200a, 200b, 200c, and 200d in the SRAM device 100 is not limited in this respect.

In some embodiments, the SRAM device 100 includes a substrate 210. The substrate 210 may be a semiconductor material and may include known structures including a graded layer or a buried oxide, for example. In some embodiments, the substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 210. Alternatively, the silicon substrate 210 may be an active layer of a semiconductor-on-insulator (SOI) substrate or a multi-layered structure such as a silicon-germanium layer formed on a bulk silicon layer.

In some embodiments, the substrate 210 includes a plurality of P-well regions 212, 214 and a plurality of N-well regions 216. As an example of memory cell 200a, each cell includes an N-well region 216 and two P-well regions 212, 214 on opposite sides of the N-well region 216. That is, the N-well region 216 is between two P-well regions 212, 214. In some embodiments, NMOS devices will be formed on the P-well regions 212, 214, and PMOS devices will be formed on N-well regions 216, which will be discussed later. In some embodiments, the P-well regions 212, 214 are implanted with P-type dopant material, such as boron ions, and the N-well regions 216 are implanted with N-type dopant material such as arsenic ions. During the implantation of the P-well regions 212, 214, the N-well regions 216 are covered with masks (such as photoresist), and during implantation of the N-well regions 216, the P-well regions 212, 214 are covered with masks (such as photoresist).

In some embodiments, the SRAM device 100 includes a plurality of semiconductor fins 220a, 220b, 220c, 220d, 220e, and 220f. For example, semiconductor fins 220a, 220b are disposed within the P-well regions 212 of the substrate 210, semiconductor fins 220b, 220c are disposed within the N-well regions 216 of the substrate 210, and semiconductor fins 220e, 220f are disposed within the N-well regions 214 of the substrate 210, respectively. In some embodiments, the semiconductor fins 220a, 220b, 220c, 220d, 220e, and 220f may be or include, for example, silicon.

In some embodiments, the semiconductor fins 220a, 220b, 220c, 220d, 220e, and 220f may be formed, for example, by patterning and etching the substrate 210 using photolithography techniques. In some embodiments, a layer of photoresist material (not shown) is deposited over the substrate 210. The layer of photoresist material is irradiated (exposed) in accordance with a desired pattern (semiconductor fins 220a, 220b, 220c, 220d, 220e, and 220f in this case) and developed to remove a portion of the photoresist material. The substrate 210 is then etched using the remaining photoresist material as an etching mask, so as to form the semiconductor fins 220a, 220b, 220c, 220d, 220e, and 220f.

In some embodiments, a plurality of isolation regions (not shown) may be formed on the substrate 210 and in the spaces between the semiconductor fins 220a, 220b, 220c, 220d, 220e, and 220f. The isolation structures, which act as a shallow trench isolation (STI) around the semiconductor fins 220a, 220b, 220c, 220d, 220e, and 220f, may be formed by chemical vapor deposition (CVD) techniques using tetraethyl-ortho-silicate (TEOS) and oxygen as a precursor.

In some embodiments, the SRAM device 100 includes gate structures 230a, 230b, 230c, 230d, 230e, and 230f. As an example in the memory cell 200a, the gate structures 230a, 230b are disposed in the P-well region 212 of the substrate 210 and cross the semiconductor fins 220a, 220b, the gate structures 230c, 230d are disposed in the N-well region 216 of the substrate 210 and cross the semiconductor fins 220c, 220d, and the gate structures 230e, 230f are disposed in the P-well region 214 of the substrate 210 and cross the semiconductor fins 220e, 220f. In some embodiments, the gate structures 230a, 230c extend continuously from to each other, and thus the gate structures 230a, 230c can also be regarded as first and second portions of a single gate structure. On the other hand, the gate structures 230d, 230f extend continuously from each other, and thus the gate structures 230d, 230f can also be regarded as first and second portions of a single gate structure.

In the P-well region 212 of the memory cell 200a, the gate structure 230a and the semiconductor fins 220a, 220b form a pull-down transistor PD-2. The gate structure 230b and the semiconductor fins 220a, 220b form a pass-gate transistor PG-2. The pull-down transistor PD-2 and the pass-gate transistor PG-2 are NMOS devices. On the other hand, In the N-well region 216 of the memory cell 200a, the gate structure 230c and the semiconductor fin 220c form a pull-up transistor PU-2. The gate structure 230d and the semiconductor fin 220d form a pull-up transistor PU-1. The pull-up transistor PU-1 and the pull-up transistor PU-2 are PMOS devices. In the P-well region 214 of the memory cell 200a, the gate structure 230e and semiconductor fins 220e, 220f form a pass-gate transistor PG-1. The gate structure 230f and semiconductor fins 220e, 220f form a pull-down transistor PD-1. The pass-gate transistor PG-1 and the pull-down transistor PD-1 are NMOS devices. Accordingly, the memory cell 200a of the SRAM device 100 is a six-transistor (6T) SRAM. One of ordinary skill in the art, however, should understand that features of the various embodiments described herein may be used for forming other types of devices, such as an 8T-SRAM memory device or other integrated circuit.

As shown in FIG. 2A, when the memory cells 200a-200d are arranged together to form an array (the SRAM device 100 herein), the cell layouts may be flipped or rotated to enable higher packing densities. Often by flipping the cell over a cell boundary or axis and placing the flipped cell adjacent the original cell, common nodes and connections can be combined to increase packing density. For example, the memory cells 200a-200d are mirror images and in rotated images of each other. Specifically, the memory cells 200a and 200b are mirror images across a Y-axis, as is the memory cells 200c and 200d. The memory cells 200a and 200c are mirror images across an X-axis, as is the memory cells 200b and 200d. Further, the diagonal memory cells (the memory cells 200a and 200d; the memory cells 200b and 200c) are rotated images of each other at 180 degrees.

The SRAM device 100 includes a plurality of gate spacers 240a, 240b, 240c, 240d, 240e, and 240f. For example, a pair of gate spacers 240a are disposed on opposite sides of the gate structure 230a, a pair of gate spacers 240b are disposed on opposite sides of the gate structure 230b, a pair of gate spacers 240c are disposed on opposite sides of the gate structure 230c, a pair of gate spacers 240d are disposed on opposite sides of the gate structure 230d, a pair of gate spacers 240e are disposed on opposite sides of the gate structure 230e, and a pair of gate spacers 240f are disposed on opposite sides of the gate structure 230f. In some embodiments, the gate spacers 240a, 240c extend continuously from each other and are made of continuous material, and thus the gate spacers 240a, 240c can also be regarded as first and second portions of a single gate spacer. On the other hand, the gate spacers 240d, 240f extend continuously from each other and are made of continuous material, and thus the gate spacers 240d, 240f can also be regarded as first and second portions of a single gate spacer. In some embodiments, the gate spacers 240a, 240b, 240c, 240d, 240e, and 240f may include $SiO_2$, $Si_3N_4$, $SiO_xN_y$, SiC, SiCN films, SiOC, SiOCN films, and/or combinations thereof.

The SRAM device 100 includes a plurality of isolation structures 250. In some embodiments, the isolation structures 250 separate parts of the gate structures 230a-230f. For example, in memory cell 200a, an isolation structure is disposed between the gate structures 230c and 230e, another isolation structure 250 is disposed between the gate structures 230b and 230d. In some embodiments, the isolation structures 250 include silicon oxide, silicon nitride or a suitable insulating material.

Reference is made to FIGS. 2A, 2B and 2C, in which FIG. 2B is a cross-sectional view along line B-B of FIG. 2A, and FIG. 2C is a cross-sectional view along line C-C of FIG. 2A. In greater detail, FIG. 2B is a cross-sectional view along a lengthwise direction of the semiconductor fin 220b and taken along the gate structure 230a, and FIG. 2C is a cross-sectional view along a lengthwise direction of the semiconductor fin 220c and taken along the gate structure 230c. It is noted that FIGS. 2B and 2C have the same scale, and thus the dimensions of FIGS. 2B and 2C are substantially the same.

In FIG. 2B, the semiconductor fin 220b is over the substrate 210, the gate structure 230a is over the semiconductor fin 220b, and the gate spacers 240a are disposed on opposite sidewalls of the gate structure 230a. In some embodiments, the gate structure 230a includes a gate dielectric layer GD, a work function metal layer WFM1, a work function metal layer WFM2, and a gate metal GM. A plurality of source/drain structures 260N, are disposed in the semiconductor fin 220b and on opposite sides of the gate structure 230a, respectively. A contact etch stop layer (CESL) 265 is disposed over the source/drain structures 260N, and along the sidewalls of the gate spacers 240a. An interlayer dielectric (ILD) layer 270 is disposed over the CESL 265.

In FIG. 2C, the semiconductor fin 220c is over the substrate 210, the gate structure 230c is over the semiconductor fin 220c, and the gate spacers 240c are disposed on opposite sidewalls of the gate structure 230c. In some embodiments, the gate structure 230c includes a gate dielectric layer GD, a work function metal layer WFM1, and a gate metal GM. A plurality of source/drain structures 260P are disposed in the semiconductor fin 220c and on opposite sides of the gate structure 230c. CESL 265 is disposed over the source/drain structures 260P and along the sidewalls of the gate spacers 240c. ILD layer 270 is disposed over the CESL 265.

Reference is made to FIGS. 2B and 2C. In some embodiments, the gate structure 230a is wider than the gate structure 230c. For example, a width W1 of the gate structure 230a is greater than a width W2 of the gate structure 230c. That is, a distance between gate spacers 240a is greater than a distance between the gate spacers 240c. On the other hand, each gate spacer 240a is narrower than each gate spacer 240c. For example, a width W3 of each gate spacer 240a is lower than a width W4 of each gate spacer 240c. Moreover, a total width W5 of the gate structure 230a and the gate spacers 240a on opposite sides of the gate structure 230a is substantially equal to the total width W6 of the gate structure 230c and the gate spacers 240c on opposite sides of the gate structure 230c. Stated another way, the width W1 of the gate structure 230a, the width W2 of the gate structure 230c, the width W3 of the gate spacers 240a, and the width W4 of the gate spacers 240c substantially satisfy (W1+2*W3)=(W2+2*W4), in which W1+2*W3=W5 and W2+2*W4=W6. From another view point, a distance between two source/drain structures 260N on opposite sides of the gate structure 230a (i.e., substantially equal to width W5) is substantially equal to a distance between two source/drain structures 260P on opposite sides of the gate structure 230c (i.e., substantially equal to width W6).

In some embodiments, the gate dielectric layers GD of the gate structures 230a, 230c are made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layers GD are oxide layers. The gate dielectric layers GD may be formed by a deposition processes, such as chemical vapor deposition (CVD), physical vapor deposition (PVD), atomic layer deposition (ALD), plasma enhanced CVD (PECVD) or other suitable techniques.

In some embodiments, the work function metal layers WFM1 of the gate structures 230a, 230c may include tantalum nitride (TaN). In some embodiments, the work function metal layer WFM2 of the gate structure 230a may include a titanium-containing material, such as, for example, titanium nitride (TiN). In some embodiments, tantalum is absent in the work function metal layer WFM2. The work function metal layers WFM1 and/or WFM2 can provide a suitable work function value for a gate structure of a semiconductor device, so as to benefit tuning the threshold voltage of the semiconductor device. The work function metal layers WFM1 and WFM2 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof. In some embodiments, the work function metal layer WFM2 is absent in the gate structure 230c of FIG. 2C. Accordingly, the gate structure 230a has more work function metal layers than the gate structure 230c.

In some embodiments, the gate metals GM of the gate structures 230a, 230c may include tungsten (W). In some other embodiments, the gate metals GM include aluminum (Al), copper (Cu) or other suitable conductive material.

In some embodiments, the source/drain structures 260N, 260P may be may be formed by performing an epitaxial growth process that provides an epitaxy material over the substrate 210, and thus the source/drain structures 260N, 260P can also be interchangeably referred to as epitaxy structures 260N, 260P in this context. In various embodiments, the source/drain structures 260N, 260P may include Ge, Si, GaAs, AlGaAs, SiGe, GaAsP, SiP, or other suitable material. In some embodiments, the source/drain structures 260N may include N-type impurities, while the source/drain structures 260P may include P type impurities.

In some embodiments, the CESL 265 includes silicon nitride, silicon oxynitride or other suitable materials. The CESL 265 can be formed using, for example, plasma enhanced CVD, low pressure CVD, ALD or other suitable techniques. The ILD layer 270 may include a material different from the CESL 265. In some embodiments, the ILD layer 270 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 270 may be formed using, for example, CVD, ALD, spin-on-glass (SOG) or other suitable techniques.

Reference is made to FIGS. 2A to 2D, in which FIG. 2D is an enlarged view of memory cell 200a of FIG. 2A. In some embodiments, the gate structure 230b and the gate spacers 240b, the gate structure 230e and the gate spacers 240e, and the gate structure 230f and the gate spacers 240f have similar or the same structure as gate structure 230a and gate spacers 240a described in FIG. 2B, respectively. On the other hand, the gate structure 230d and the gate spacers 240d have similar or the same structure as gate structure 230c and gate spacers 240c described in FIG. 2C, respectably. For example, each of the gate structures 230b, 230e, and 230f includes a gate dielectric layer GD, a work function metal layer WFM1, a work function metal layer WFM2, and a gate metal GM, and the gate structure 230d includes a gate dielectric layer GD, a work function metal layer WFM1, and a gate metal GM.

With respect to the gate structures 230a and 230c, the gate structure 230a extends continuously from the gate structures 230c. In greater detail, the gate dielectric layer GD of the gate structure 230a and the gate dielectric layer GD of the gate structure 230c are continuous material, the work function metal layer WFM1 of the gate structure 230a and the work function metal layer WFM1 are continuous material, and the gate metal GM of the gate structure 230a and the gate metal GM of the gate structure 230c are continuous material. This is because such elements of gate structures 230a, 230c are formed at the same time, which will be discussed later. Accordingly, the combination of the gate structures 230a, 230c can also be regarded as a single gate structure, in which the gate structures 230a, 230c can be referred to as first and second portions of the single gate structure. In some embodiments, the gate structures 230a, 230c in combination form a stepped sidewall profile.

Further, the gate spacers 240a and the gate spacers 240c are continuous material, as they are formed at the same time. That is, there is no interface between each gate spacer 240a and its adjacent gate spacer 240c. Accordingly, the combination of each gate spacer 240a and its adjacent gate spacer 240c can also be regarded as a single gate spacer, in which the gate spacers 240a, 240c can be referred to as first and second portions of the single gate spacer. In some embodiments, in a top view of FIG. 2D, the outer sidewall of the gate spacer 240a (i.e., sidewall farthest from the gate structure 230a) is aligned (coterminous) with and contacts the outer sidewall of the gate spacer 240c (i.e., sidewall farthest from to the gate structure 230c). On the other hand, in a top view of FIG. 2D, the inner sidewall of the gate spacer 240a (i.e., sidewall closest to the gate structure 230a) is misaligned with the inner sidewall of the gate spacer 240c (i.e., sidewall closest to the gate 230a structure 230c). This is also in consistent with that the gate spacers 240a and 240c have different widths, as described in FIGS. 2B and 2C. In some embodiments, the gate spacers 240a, 240c in combination form a stepped sidewall profile.

As the inner sidewall of the gate spacer 240a is misaligned with the inner sidewall of the gate spacer 240c, although the gate dielectric layer GD of the gate structure 230a and the gate dielectric layer GD of the gate structure 230c are continuous material, the gate dielectric layer GD of the gate structure 230a is misaligned with the gate dielectric layer GD of the gate structure 230c, as well as the work function metal layers WFM1 of the gate structures 230a, 230c. In some embodiments, in the top view of FIG. 2D, the gate metal GM of the gate structure 230a has a first portion GM-1 and a second portion GM-2, in which the second portion GM-2 is narrow than the first portion GM-1 along the lengthwise direction of the semiconductor fin 220b as well as the direction perpendicular to the lengthwise direction of the semiconductor fin 220b. On the other hand, along the lengthwise direction of the semiconductor fin 220b, the gate metal GM of the gate structure 230c is wider than the second portion GM-2 of the gate metal GM of the gate structure 230a and is narrower than the first portion GM-1 of the gate metal GM of the gate structure 230a. In some embodiments, the second portion GM-2 of the gate metal GM of the gate structure 230a contacts the gate metal GM of the gate structure 230c. In some embodiments, the gate dielectric layer GD of the gate structure 230a contacts a longitudinal end of the gate structure 230c.

In some embodiments, the above discussed relationships between gate structures 230a and 230c and between gate spacers 240a and 240c can also be found at gate structures 230f and 230d, and gate spacers 240f and 240d, which will not be repeated for brevity.

With respect to the gate structures 230b and 230d, there is an isolation structure 250 between and contacts the gate structures 230b and 230d. The isolation structure 250 substantially extends along a border between the P-well region 212 and the N-well region 216. In the top view of FIG. 2D and along the lengthwise direction of the semiconductor fin 220b, the interface between the gate structure 230b and the isolation structure 250 is longer than the interface between the gate structure 230d and the isolation structure 250, while the interface between the gate spacer 240b and the isolation structure 250 is shorter than the interface between the gate spacer 240d and the isolation structure 250. However, the total thickness of the gate structure 230b and the gate spacers 240b on opposite sides of the gate structure 230b is substantially equal to the total thickness of the gate structure 230d and the gate spacers 240d on opposite sides of the gate structure 230d. Although the gate structures 230b and 230d are separated by the isolation structure 250, the outer sidewall of the gate spacer 240b is substantially aligned with the outer sidewall of the gate spacer 240d, and the inner sidewall of the gate spacer 240b is misaligned with the inner sidewall of the gate spacer 240d.

In some embodiments, the above discussed relationships between gate structures 230b and 230d and between gate spacers 240b and 240d can also be found at gate structures 230e and 230c, and gate spacers 240e and 240c, which will not be repeated for brevity.

FIGS. 3 to 21B illustrate a method in various stages of fabricating a memory device in accordance with some embodiments of the present disclosure.

Figure 3:
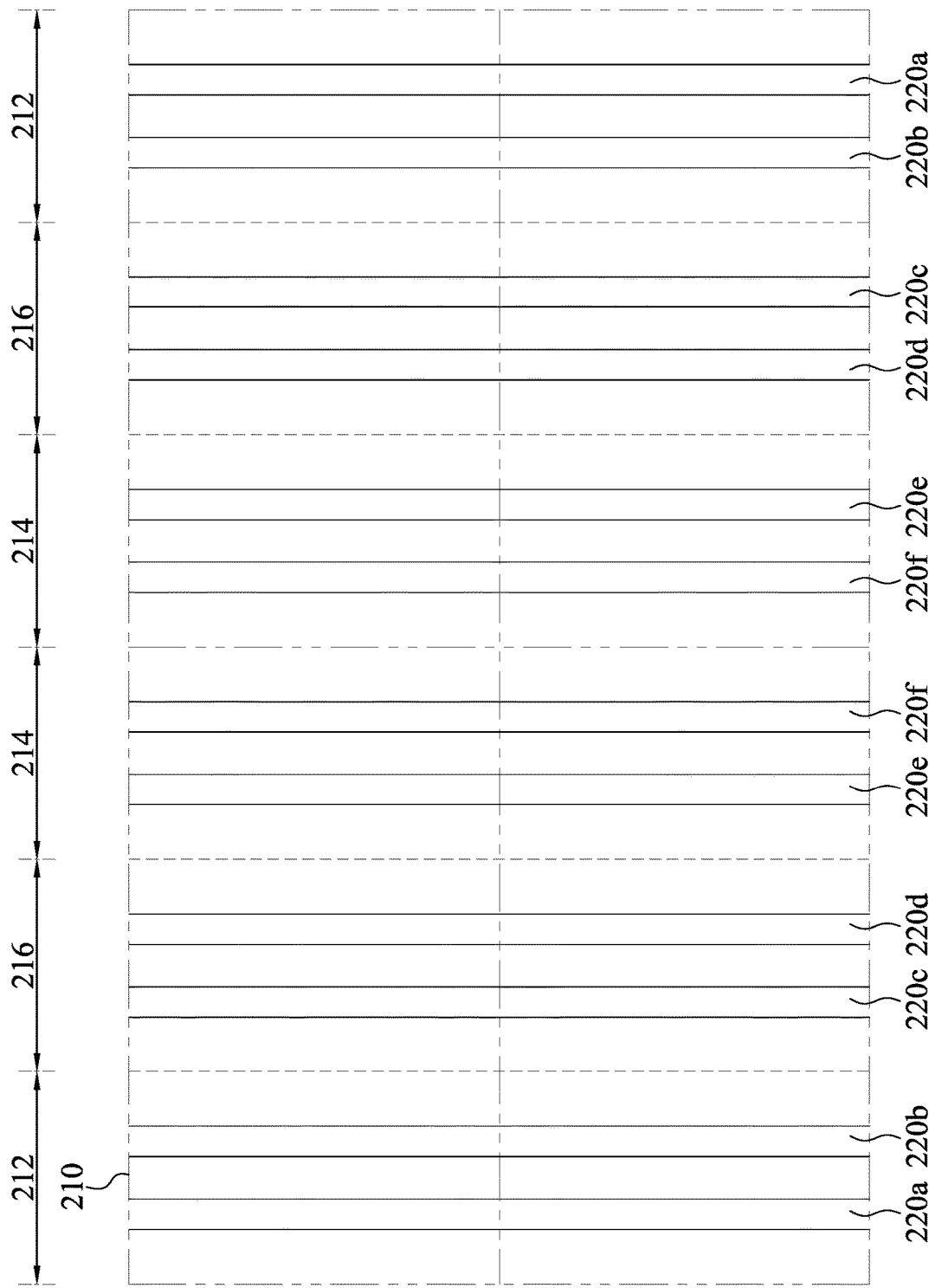
FIGS. 3 to 17 illustrate a method in various stages of fabricating a memory device in accordance with some embodiments of the present disclosure.

Reference is made to FIG. 3. A plurality of semiconductor fins 220a, 220b, 220c, 220d, 220e, and 220f are formed over a substrate 210. The semiconductor fins 220a-220f may be formed, for example, by patterning and etching the substrate 210 using photolithography techniques. In some embodiments, the substrate 210 includes a plurality of P-well regions 212, 214 and a plurality of N-well regions 216. In some embodiments, the P-well regions 212, 214 are implanted with P-type dopant material, such as boron ions, and the N-well regions 216 are implanted with N-type dopant material such as arsenic ions. During the implantation of the P-well regions 212, 214, the N-well regions 216 are covered with masks (such as photoresist), and during implantation of the N-well regions 216, the P-well regions 212, 214 are covered with masks (such as photoresist).

Figure 4A:
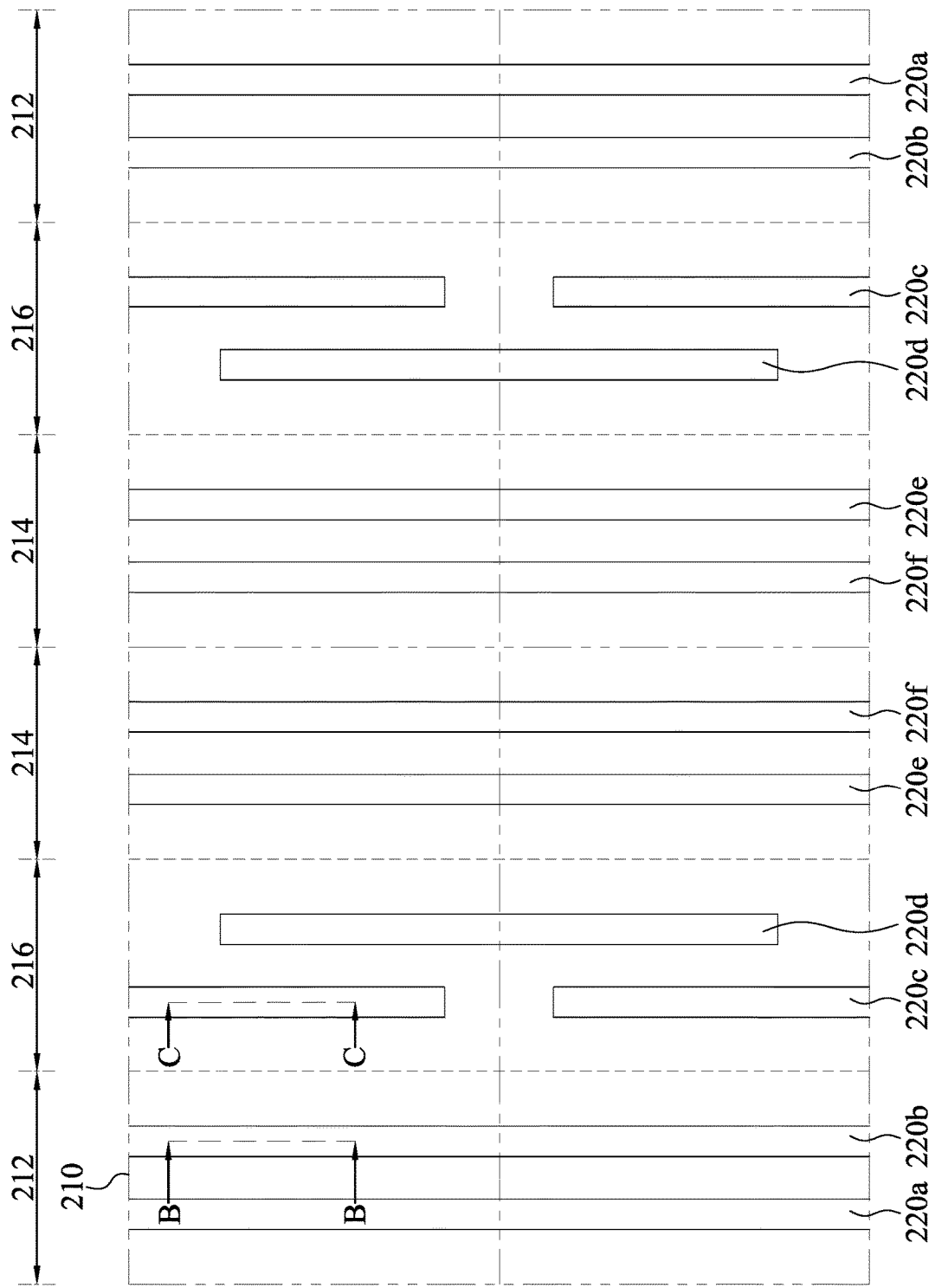
Figure 4C:
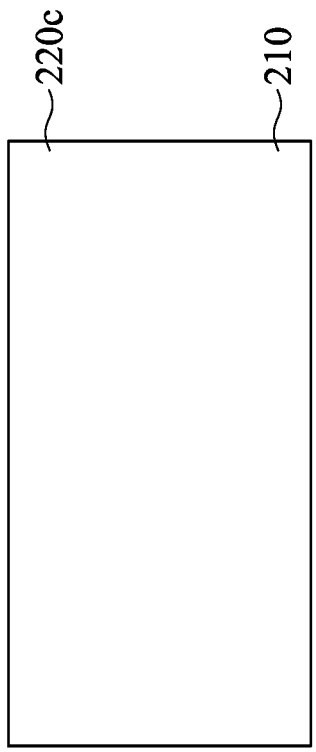
Figure 4B:
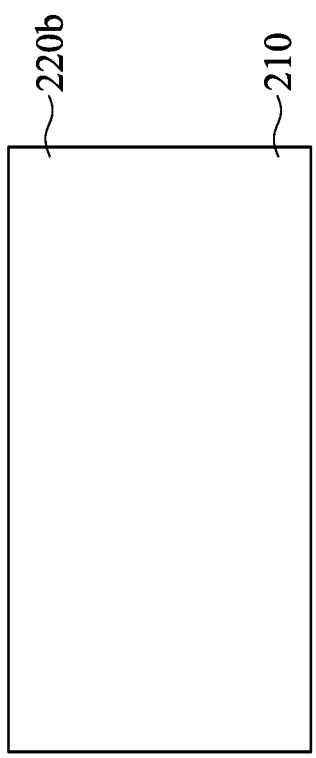

Reference is made to FIGS. 4A to 4C, in which FIG. 4B is a cross-sectional view along line B-B of FIG. 4A, and FIG. 4C is a cross-sectional view along line C-C of FIG. 4A. Portions of the semiconductor fins 220c and 220d are removed. For example, a photomask (not shown) is formed over the substrate 210 and exposes portions of the semiconductor fins 220c and 220d, followed by an etching process to remove the exposed portions of the semiconductor 220c and 220d. The resulting structure is shown in FIG. 4A. After the etching process, the photomask may be removed. The etching process at this step can be interchangeably referred to as a fin cut process.

Figure 5A:
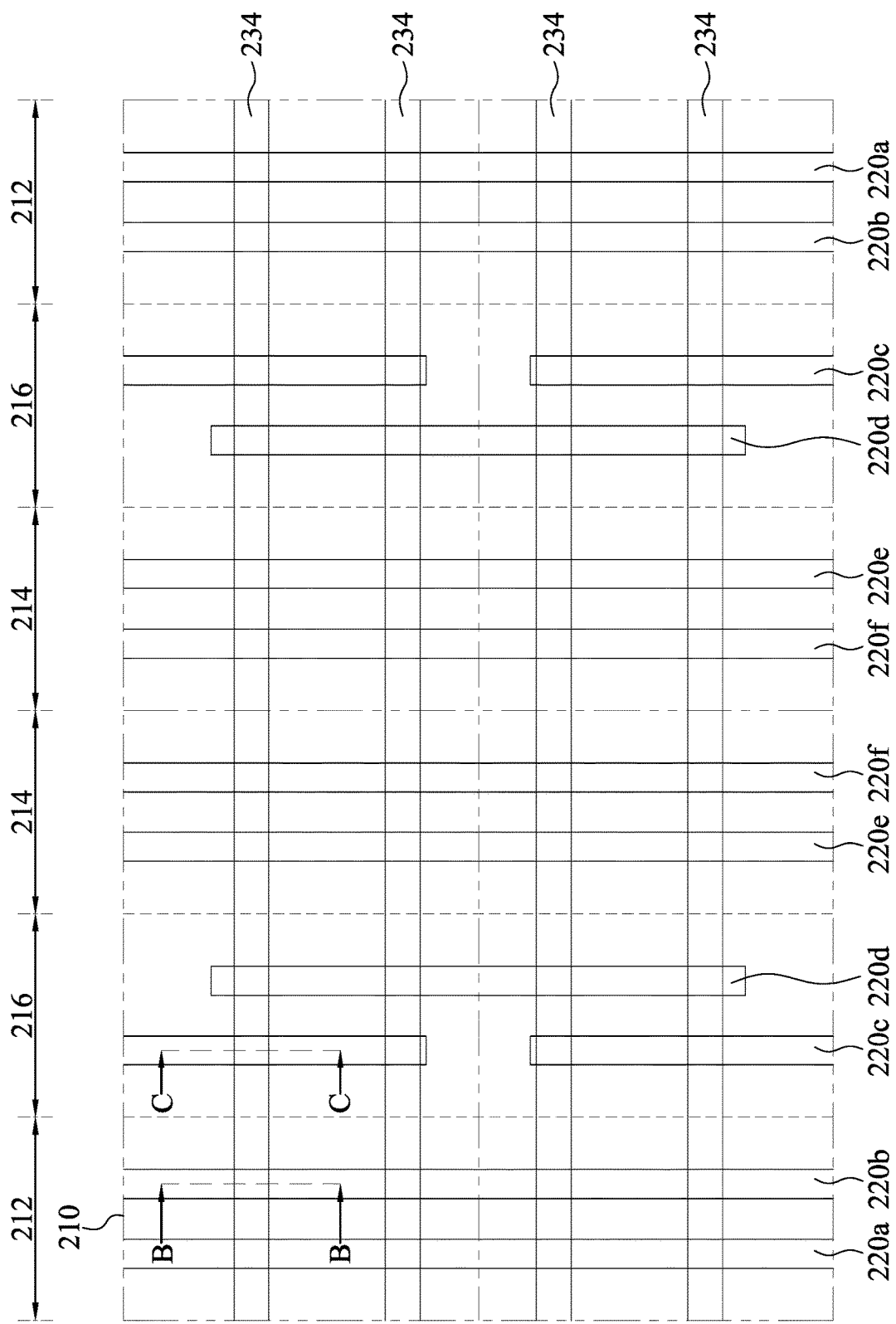
Figure 5C:
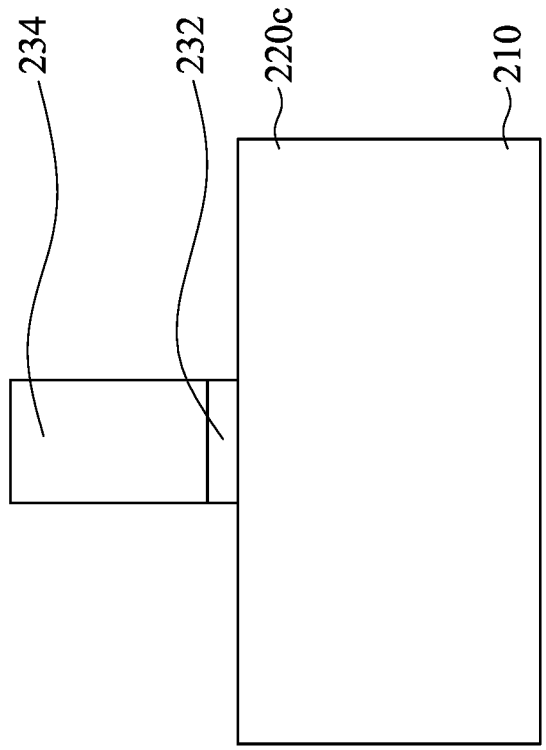
Figure 5B:
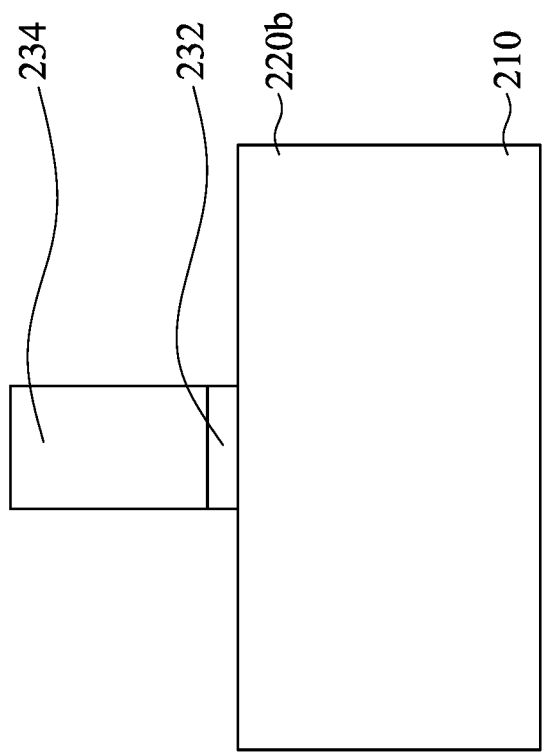

Reference is made to FIGS. 5A to 5C, in which FIG. 5B is a cross-sectional view along line B-B of FIG. 5A, and FIG. 5C is a cross-sectional view along line C-C of FIG. 5A. It is noted that some elements in FIGS. 5B and 5C are not illustrated in FIG. 5A for simplicity. A plurality of gate dielectric layers 232 and a plurality of dummy gate layers 234 are formed over the substrate 210 and cross the semiconductor fins 220a-220f. In some embodiments the gate dielectric layers 232 and the dummy gate layers 234 can be collectively referred to as dummy gate structure.

The gate dielectric layers 232 may be, for example, silicon oxide, silicon nitride, a combination thereof, or the like, and may be deposited or thermally grown according to acceptable techniques. The gate dielectric layers 232 may be formed by suitable process, such as chemical vapor deposition (CVD), physical vapor deposition (PVD), atomic layer deposition (ALD), or any suitable process. The dummy gate layers 234 may be deposited over the gate dielectric layers 232 and then planarized, such as by a CMP. The dummy gate layers 234 may include polycrystalline-silicon (poly-Si) or poly-crystalline silicon-germanium (poly-SiGe). Further, the dummy gate layers 234 may be doped poly-silicon with uniform or non-uniform doping. The dummy gate layers 234 may be formed by suitable process, such as chemical vapor deposition (CVD), physical vapor deposition (PVD), atomic layer deposition (ALD), or any suitable process.

Figure 6A:
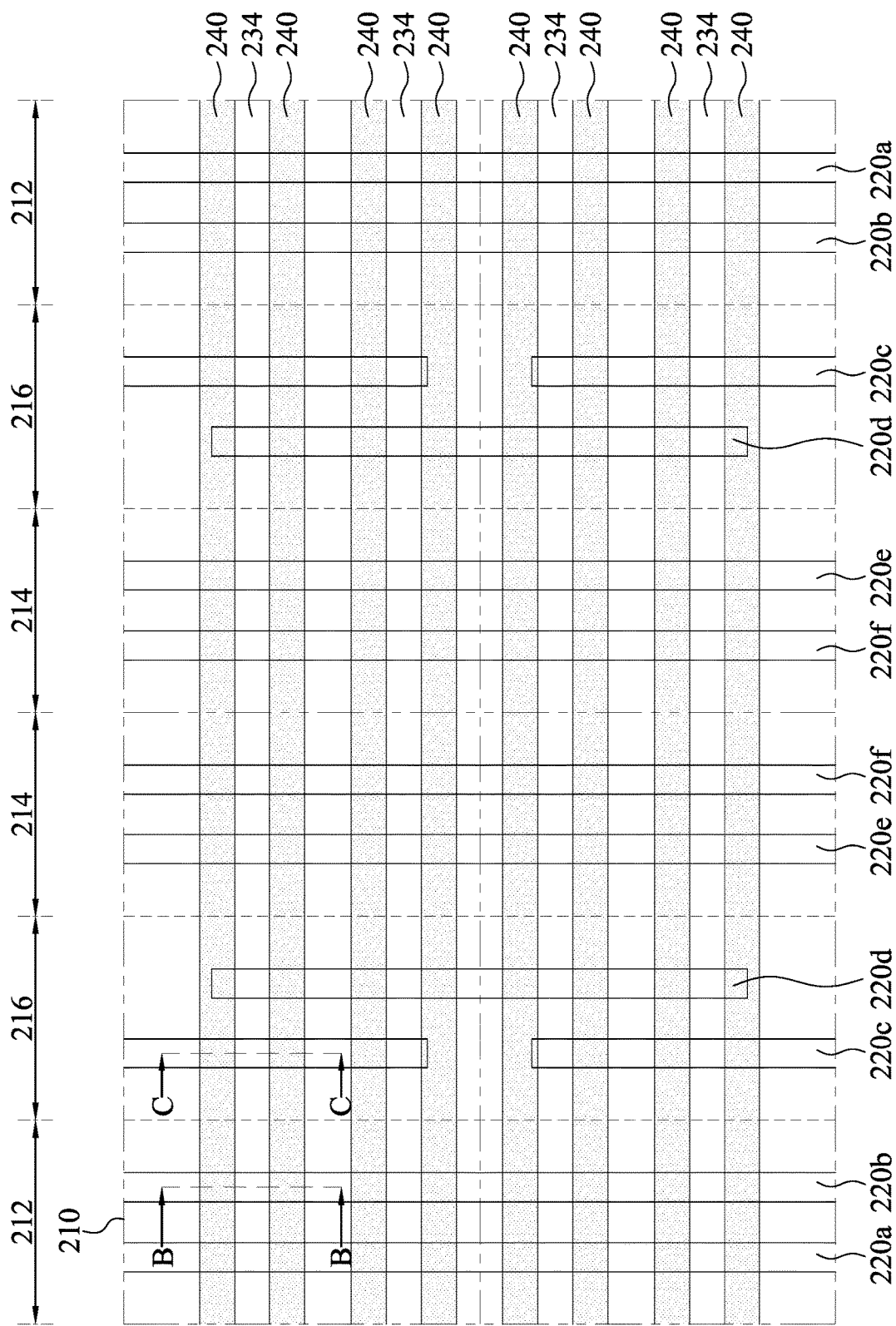
Figure 6C:
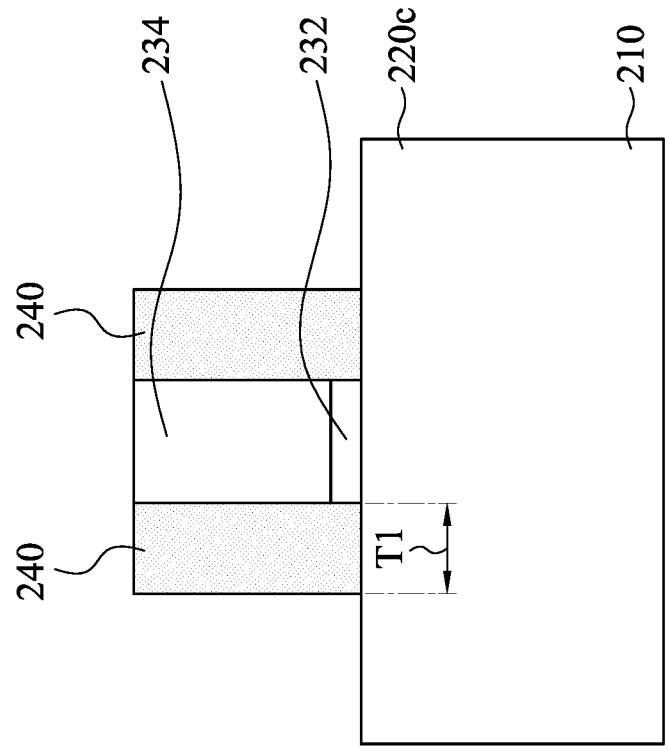
Figure 6B:
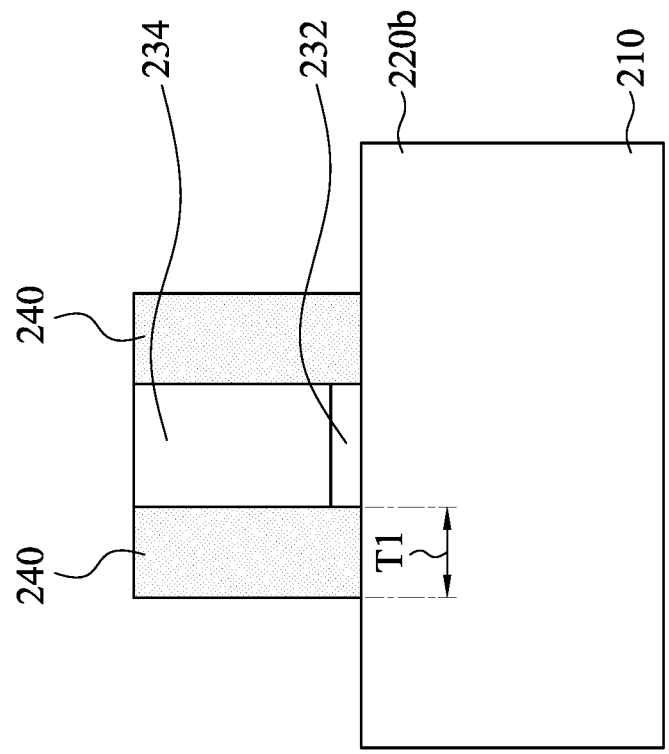

Reference is made to FIGS. 6A to 6C, in which FIG. 6B is a cross-sectional view along line B-B of FIG. 6A, and FIG. 6C is a cross-sectional view along line C-C of FIG. 6A. A plurality of gate spacers 240 are formed on opposite sidewalls of the dummy gate layers 234. The gate spacers 240 may be formed by, for example, depositing a spacer layer blanket over the dummy gate layers 234, followed by an anisotropic etching process to remove horizontal portions of the spacer layer, such that vertical portions of the spacer layer remain on sidewalls of the dummy gate layers 234. In some embodiments, the gate spacers 240 may be formed by CVD, SACVD, flowable CVD, ALD, PVD, or other suitable process. In some embodiments, the thickness T1 of the gate spacers 240 is in a range of about 1.5 nm to about 4 nm.

Figure 7B:
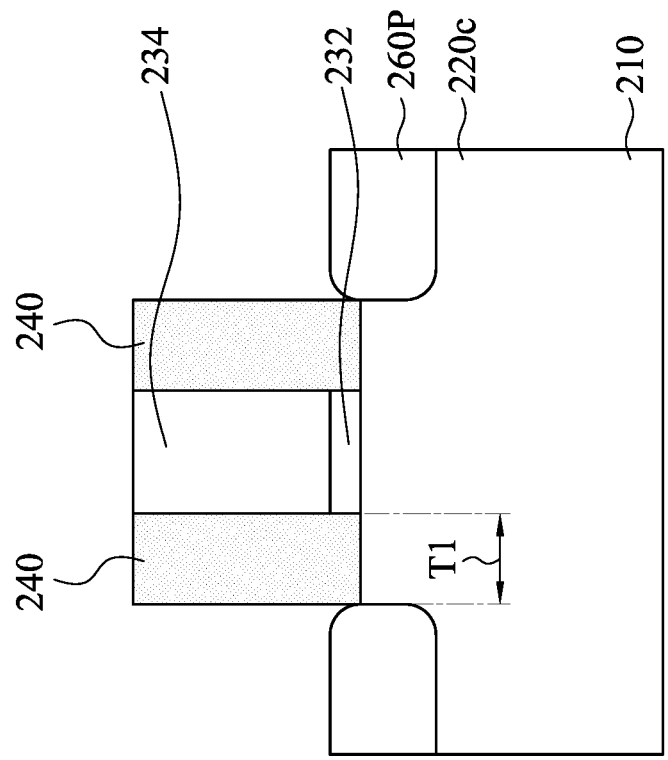
Figure 7A:
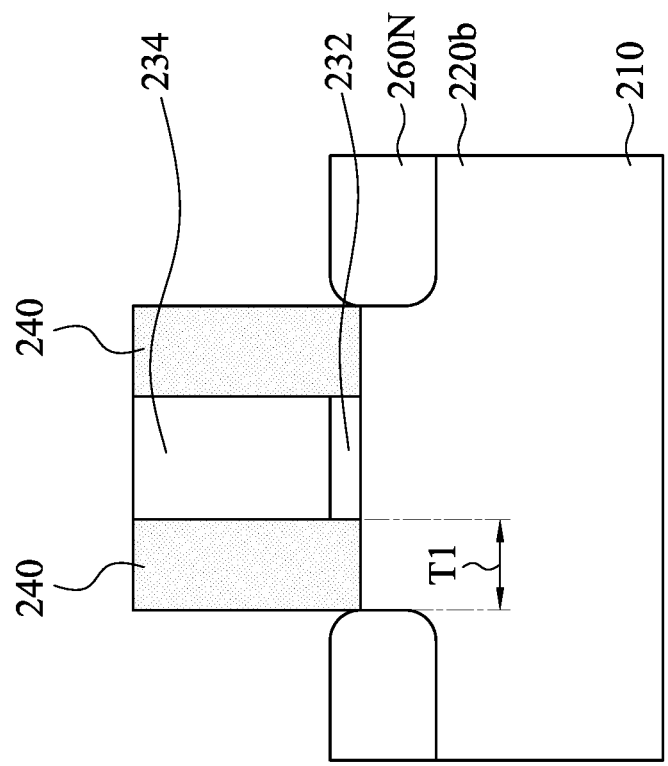

Reference is made to FIGS. 7A and 7B, in which FIGS. 7A and 7B follow the cross-section of FIGS. 6B and 6C. A plurality of source/drain structures 260N, 260P are formed over the semiconductor fins 220b and 220c of the substrate 210, respectively. For example, the exposed portions of the semiconductor fins 220b and 220c exposed by the dummy gate layers 234 and the gate spacers 240 are recessed by suitable process, such as etching. Afterwards, the source/drain structures 260 are formed respectively over the exposed surfaces of the remaining semiconductor fins 220b and 220c. The source/drain structures 260N, 260P may be formed by performing an epitaxial growth process that provides an epitaxy material over the semiconductor fins 220b and 220c. In some embodiments, the source/drain structures 260N may include N-type impurities, while the source/drain structures 260P may include N-type impurities. It is understood that, although not shown in FIGS. 7A and 7B, the source/drain structures 260N are also formed in the semiconductor fins 220a, 220e, and 220f, and the source/drain structures 260P are also formed in the semiconductor fins 220d as shown in FIG. 6A.

Figure 8B:
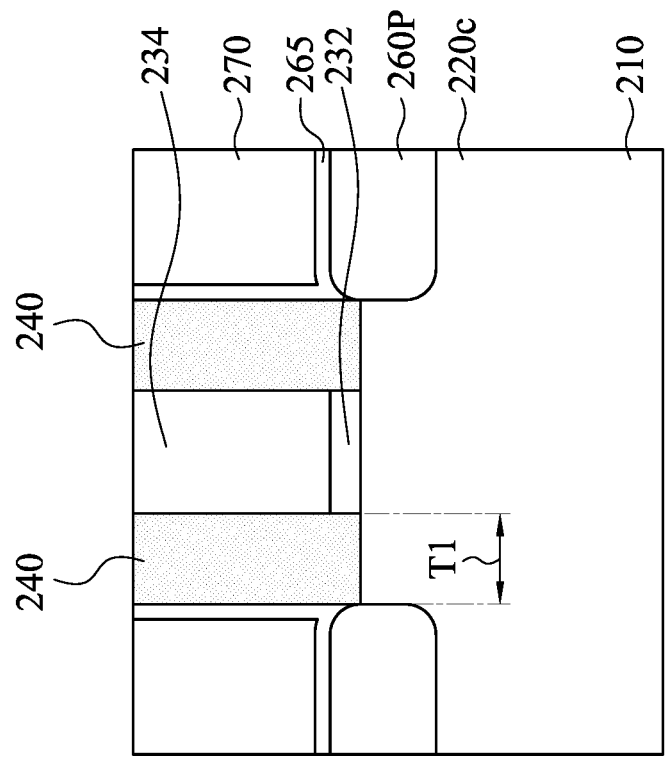
Figure 8A:
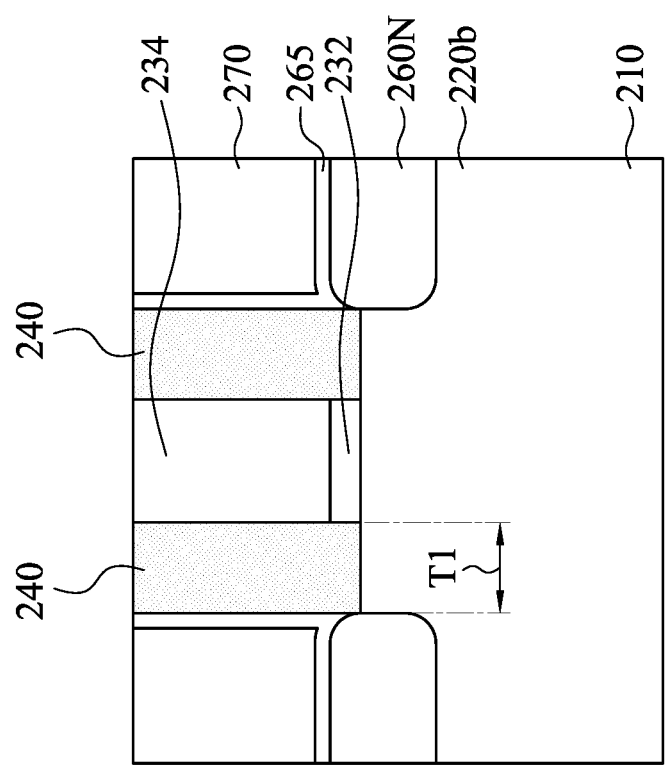

Reference is made to FIGS. 8A and 8B, in which FIGS. 8A and 8B follow the cross-section of FIGS. 7A and 7B. A contact etch stop layer (CESL) 265 and an interlayer dielectric (ILD) layer 270 are formed over the substrate 210 and over the source/drain structures 260. For example, a CESL material and a ILD material may be deposited sequentially over the substrate 210, followed by a CMP process to remove excessive CESL material and ILD material until the top surfaces of the dummy gate layers 234 are exposed. The CESL 265 can be formed using, for example, plasma enhanced CVD, low pressure CVD, ALD or other suitable techniques. The ILD layer 270 may be formed using, for example, CVD, ALD, spin-on-glass (SOG) or other suitable techniques.

Figure 9A:
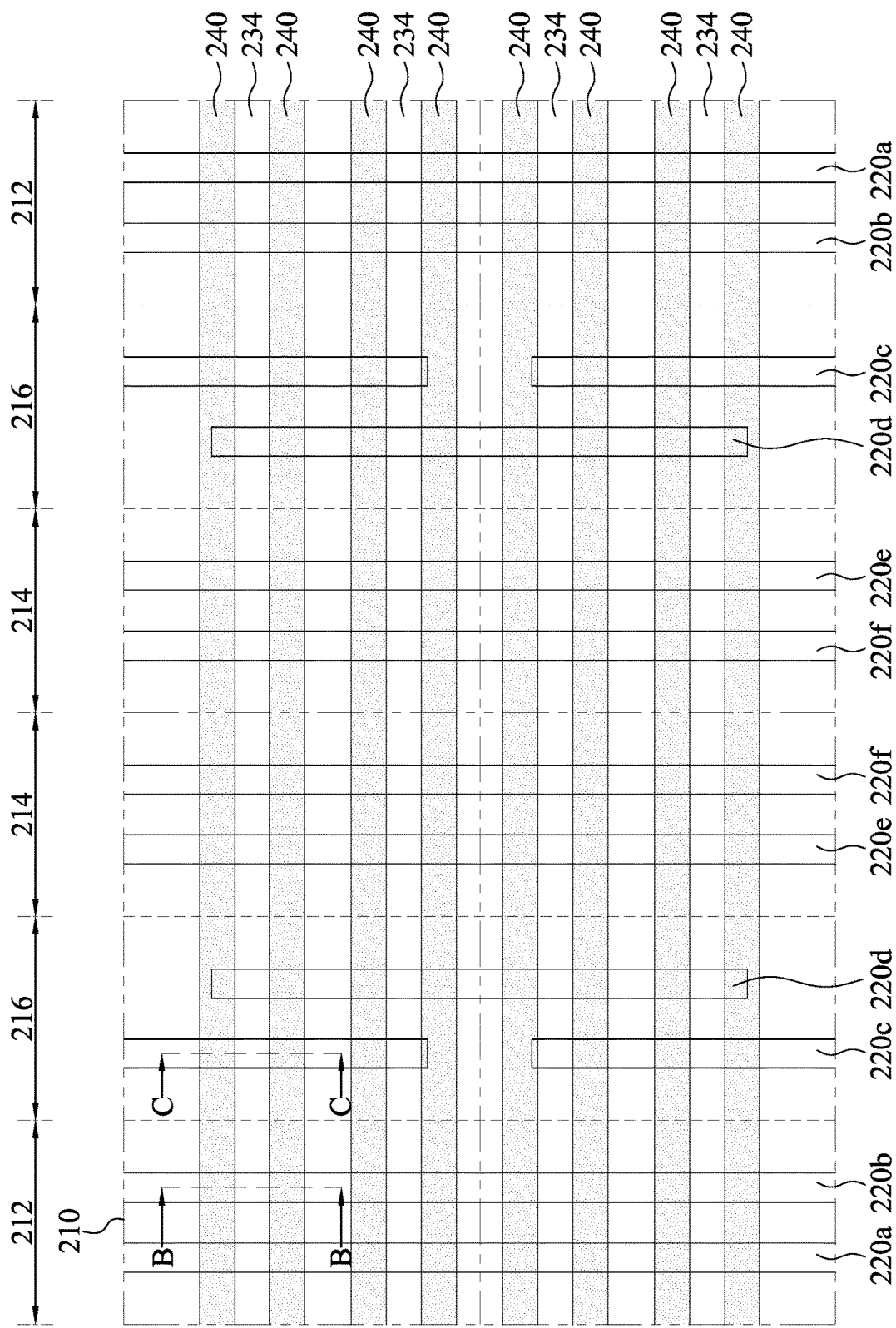
Figure 9C:
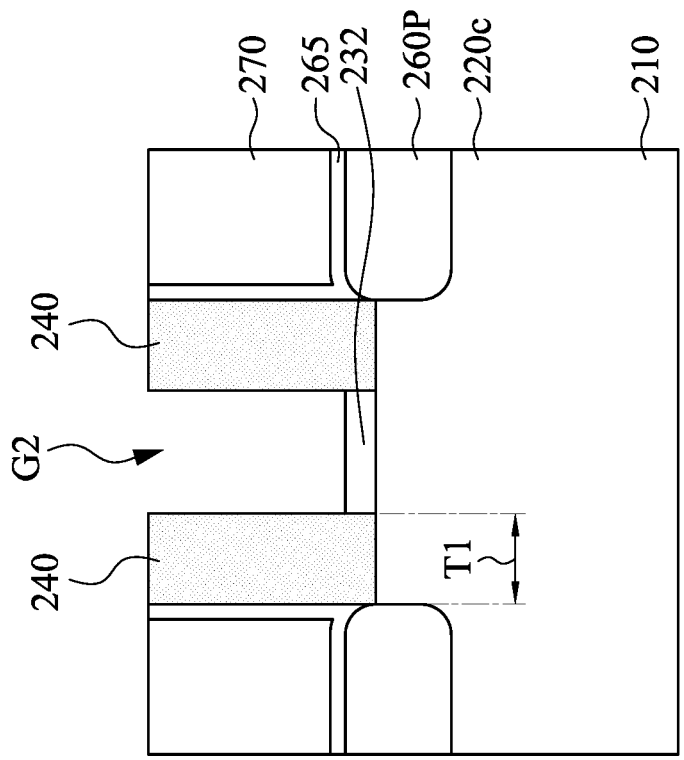
Figure 9B:
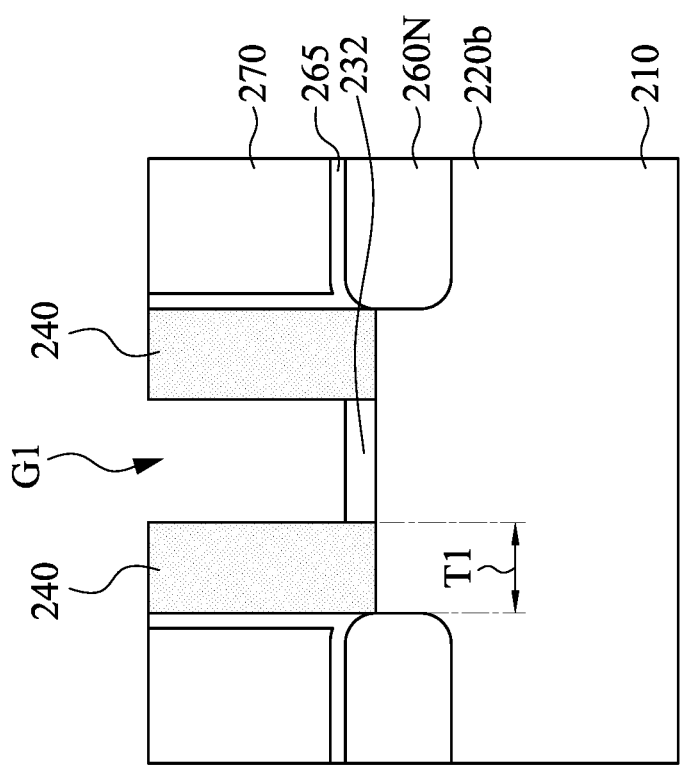

Reference is made to FIGS. 9A to 9C, in which FIG. 9B is a cross-sectional view along line B-B of FIG. 9A, and FIG. 9C is a cross-sectional view along line C-C of FIG. 9A. The dummy gate layers 234 are removed. In some embodiments, the dummy gate layers 234 may be removed by suitable process, such as etching. After the dummy gate layers 234 are removed, a gate trench G1 is formed between the gate spacers 240 over the semiconductor fin 220b, and a gate trench G2 is formed between the gate spacers 240 over the semiconductor fin 220c. In some embodiments, the gate dielectric layers 232 remain after removing the dummy gate layers 234, such that the gate dielectric layers 232 are exposed by the trenches G1 and G2.

Figure 10A:
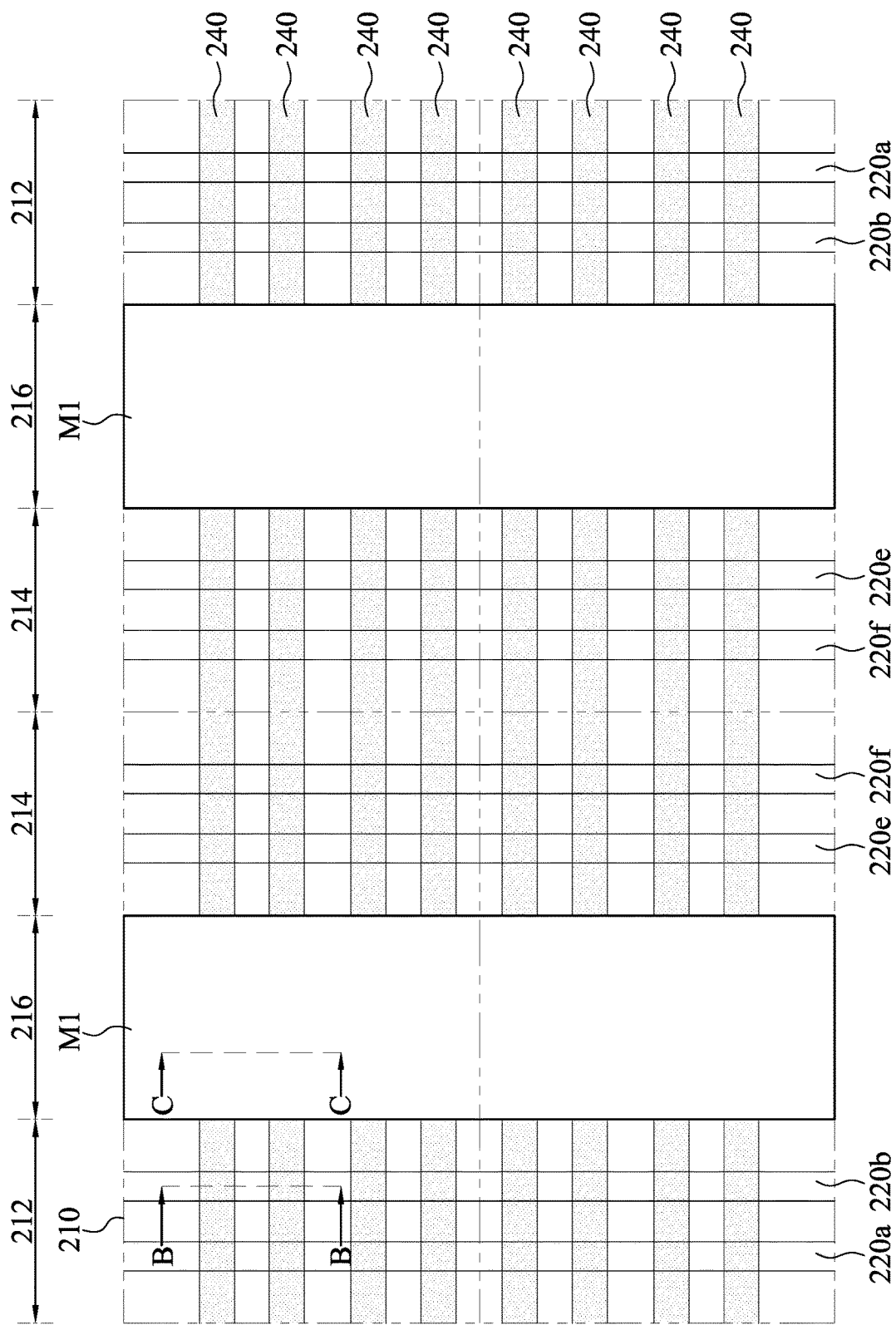
Figure 10C:
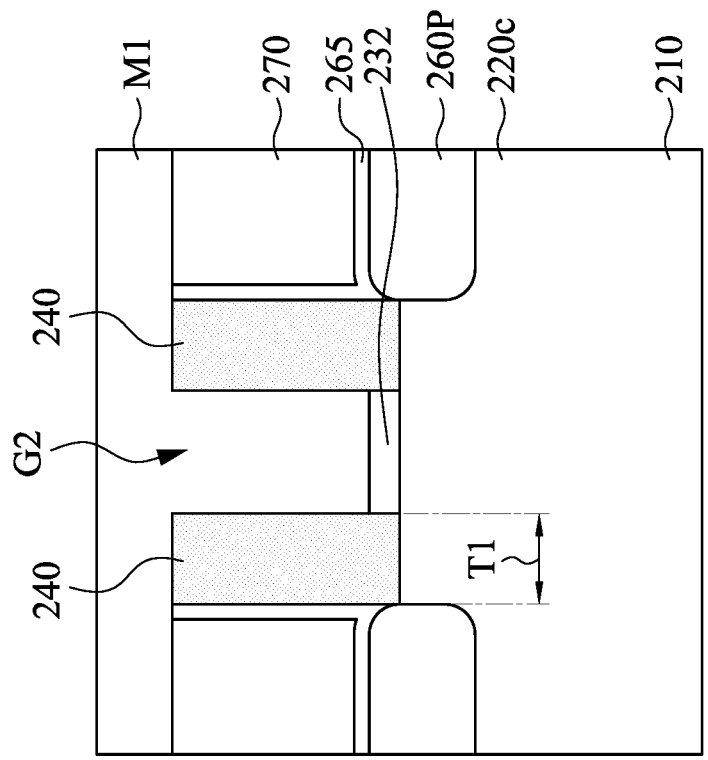
Figure 10B:
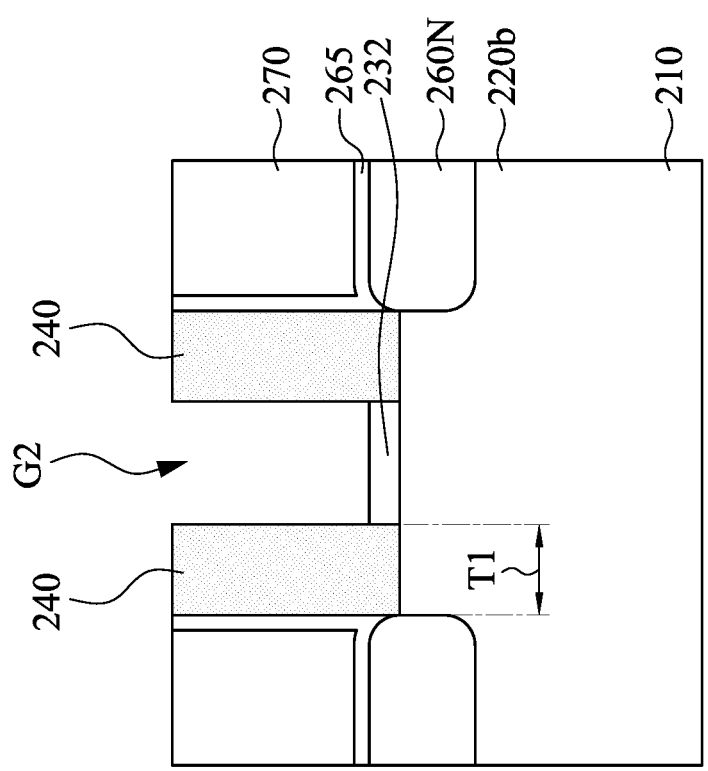

Reference is made to FIGS. 10A to 10C, in which FIG. 10B is a cross-sectional view along line B-B of FIG. 10A, and FIG. 10C is a cross-sectional view along line C-C of FIG. 10A. A mask layer M1 is formed over the substrate 210, in which the mask layer M1 exposes the P-well regions 212, 214 of the substrate 210 and covers the N-well regions 216 of the of the substrate 210. In greater detail, the mask layer M1 covers the semiconductor fins 220c, 220d, while exposes the semiconductor fins 220a, 220b, 220e, 220f. As shown in FIGS. 9B and 9C, the trench G2 over the semiconductor fin 220c is filled with the mask layer M1, and thus the gate dielectric layer 232 within the trench T2 over the semiconductor fin 220c is covered by the mask layer M1. In some embodiments, the mask layer M1 may be photoresist, and may be formed by suitable photolithography process.

Figure 11A:
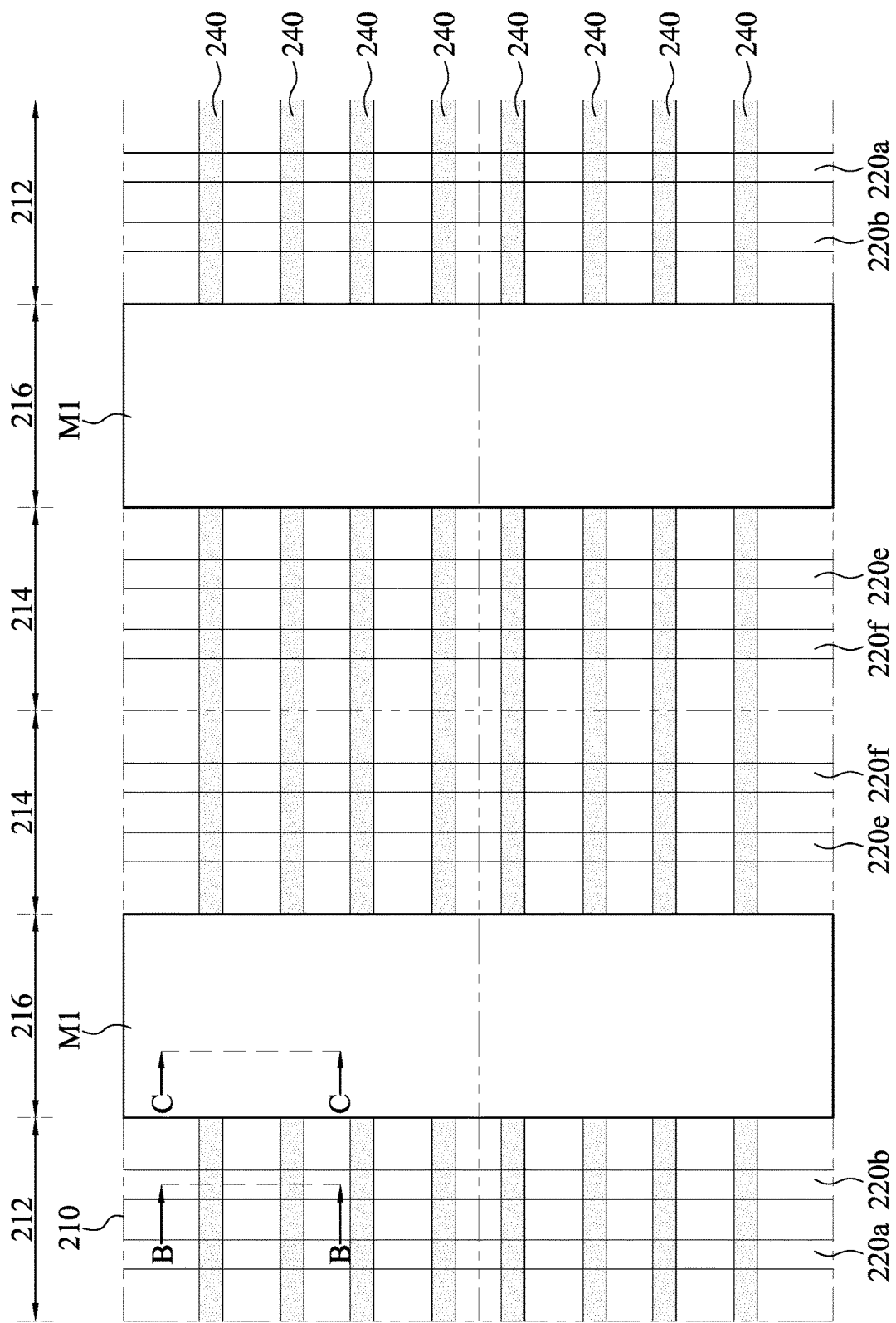
Figure 11C:
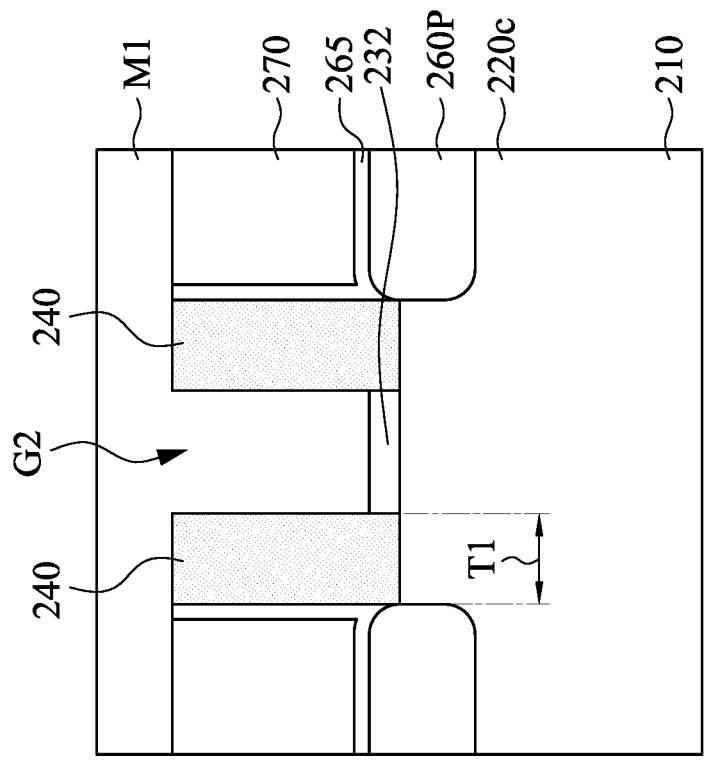
Figure 11B:
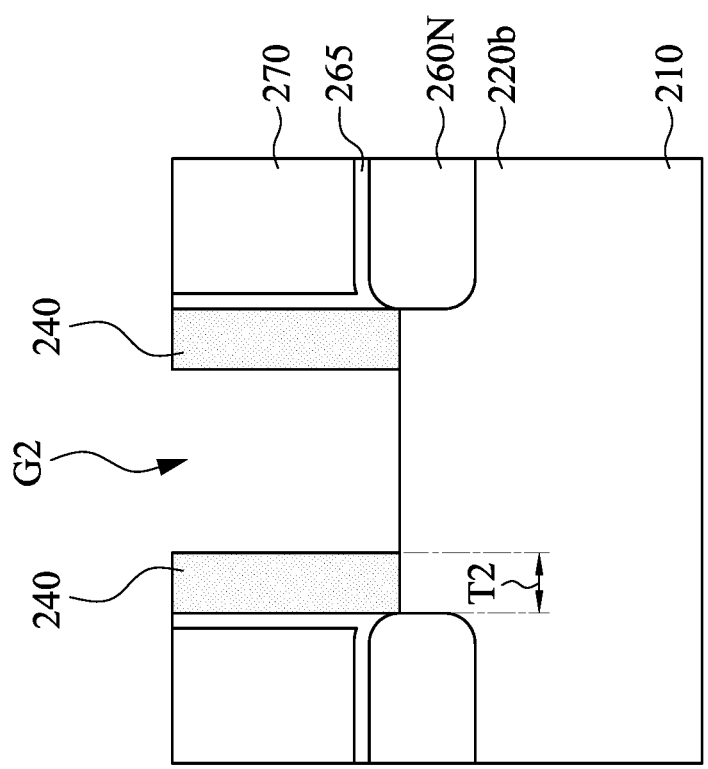

Reference is made to FIGS. 11A to 11C, in which FIG. 11B is a cross-sectional view along line B-B of FIG. 11A, and FIG. 11C is a cross-sectional view along line C-C of FIG. 11A. The gate dielectric layer 232 exposed by the gate trench G1 over the semiconductor fin 220b is removed, and the gate spacers 240 over the semiconductor fin 220b are thinned. In greater detail, the gate dielectric layer 232 over the semiconductor fins 220a, 220b, 220e, 220f within the P-well regions 212, 214 are removed, and the gate spacers 240 over the semiconductor fins 220a, 220b, 220e, 220f within the P-well regions 212, 214 are thinned (see FIG. 11A). On the other hand, the gate dielectric layers 232 and gate spacers 240 over the semiconductor fins 220c, 220d within the N-well regions 216 are protected by the mask layer M1. In some embodiments, the gate dielectric layer 232 can be removed by suitable process, such as etching. For example, the etchant for etching the gate dielectric layer 232 may be HF.

In FIG. 11B, during etching the gate dielectric layer 232, the gate spacers 240 may also be etched by some amounts using the same etchant. For example, the gate spacers 240 may have original thickness T1 (see FIG. 1013), and the etched gate spacers 240 may have thickness T2. In some embodiments, the thickness T2 is lower than the thickness T1. The difference between thicknesses T1 and T2 is the thickness loss during the etching process described in FIGS. 11A to 11C. In some embodiments, the thickness loss (e.g., T1-T2) is in a range from about 0.5 nm to about 3 nm. As the gate spacers 240 over the semiconductor fin 220b are etched, the etched gate spacers 240 over the semiconductor fin 220b are thinner than the gate spacers 240 over the semiconductor fin 220c that is protected by the mask layer M1 (see FIG. 11C), in which gate spacers 240 over the semiconductor fin 220c remain their original thickness T1.

Figure 12A:
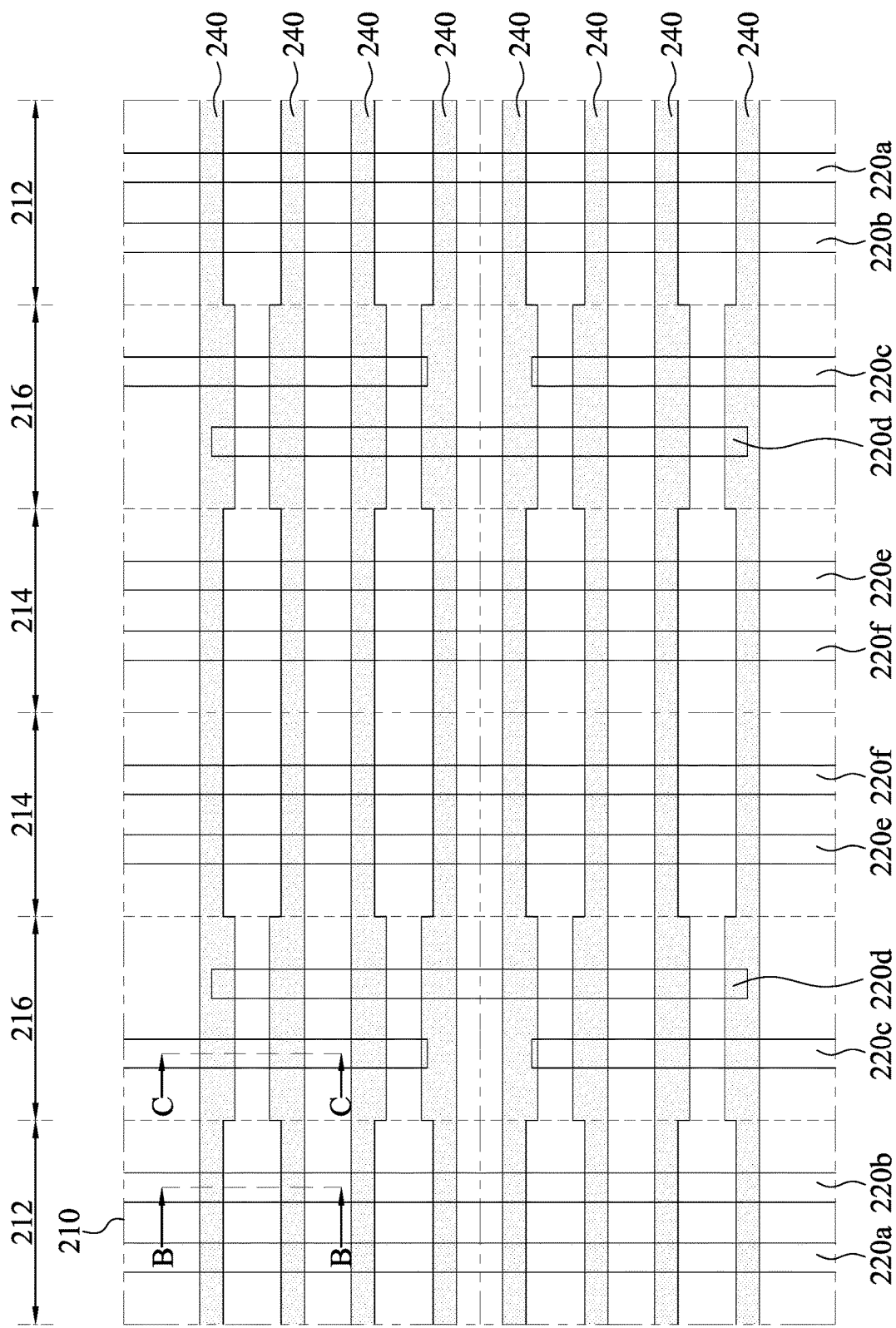
Figure 12C:
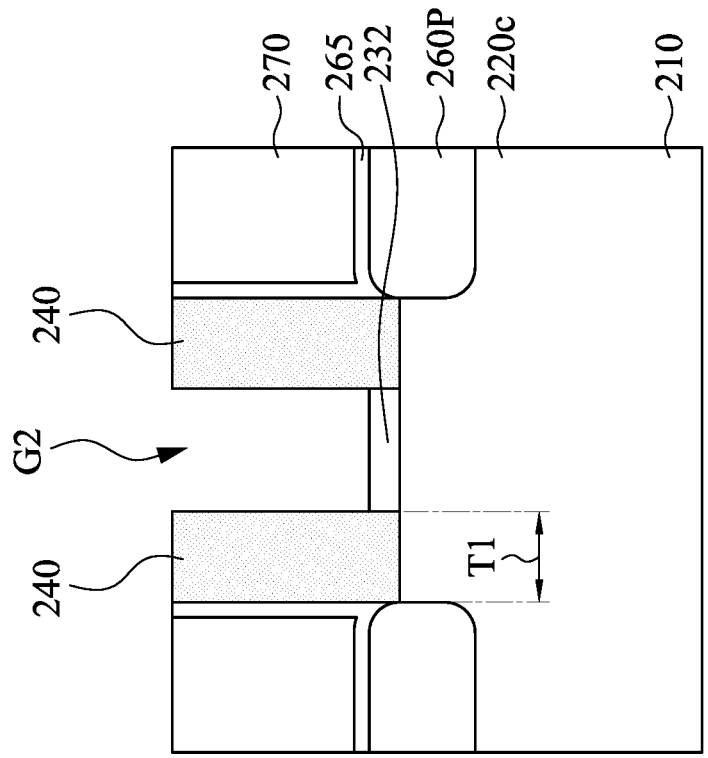
Figure 12B:
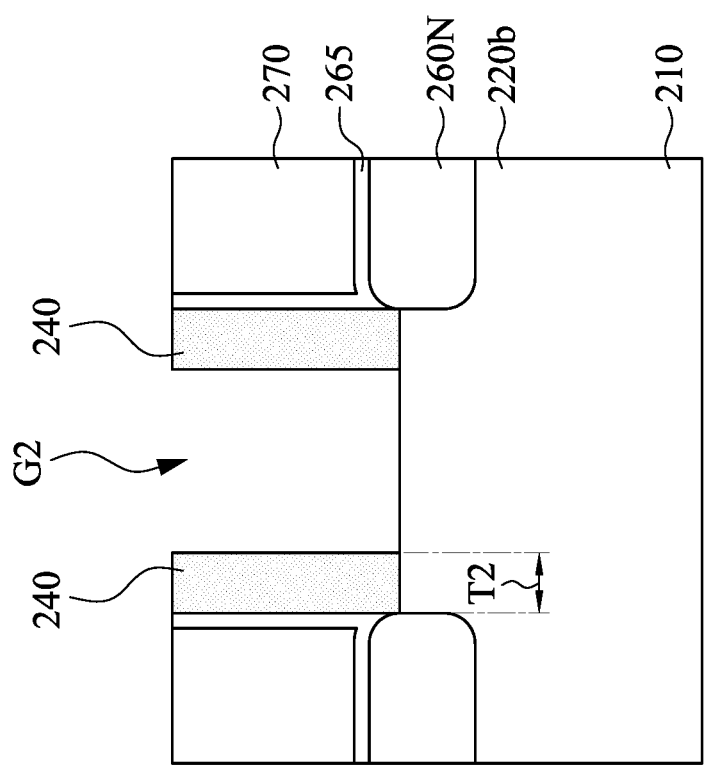

Reference is made to FIGS. 12A to 12C, in which FIG. 12B is a cross-sectional view along line B-B of FIG. 12A, and FIG. 12C is a cross-sectional view along line C-C of FIG. 12A. The mask layer M1 is removed. In some embodiments, the mask layer M1 can be removed by suitable process, such as stripping. As a result, the gate dielectric layer 232 over the semiconductor fin 220c is exposed by the gate trench G2. It is noted that in this stage, the top surface of the semiconductor fin 220b is free of coverage of the gate dielectric layer 232, because the gate dielectric layer 232 on the top surface of the semiconductor fin 220b has been removed.

Figure 13A:
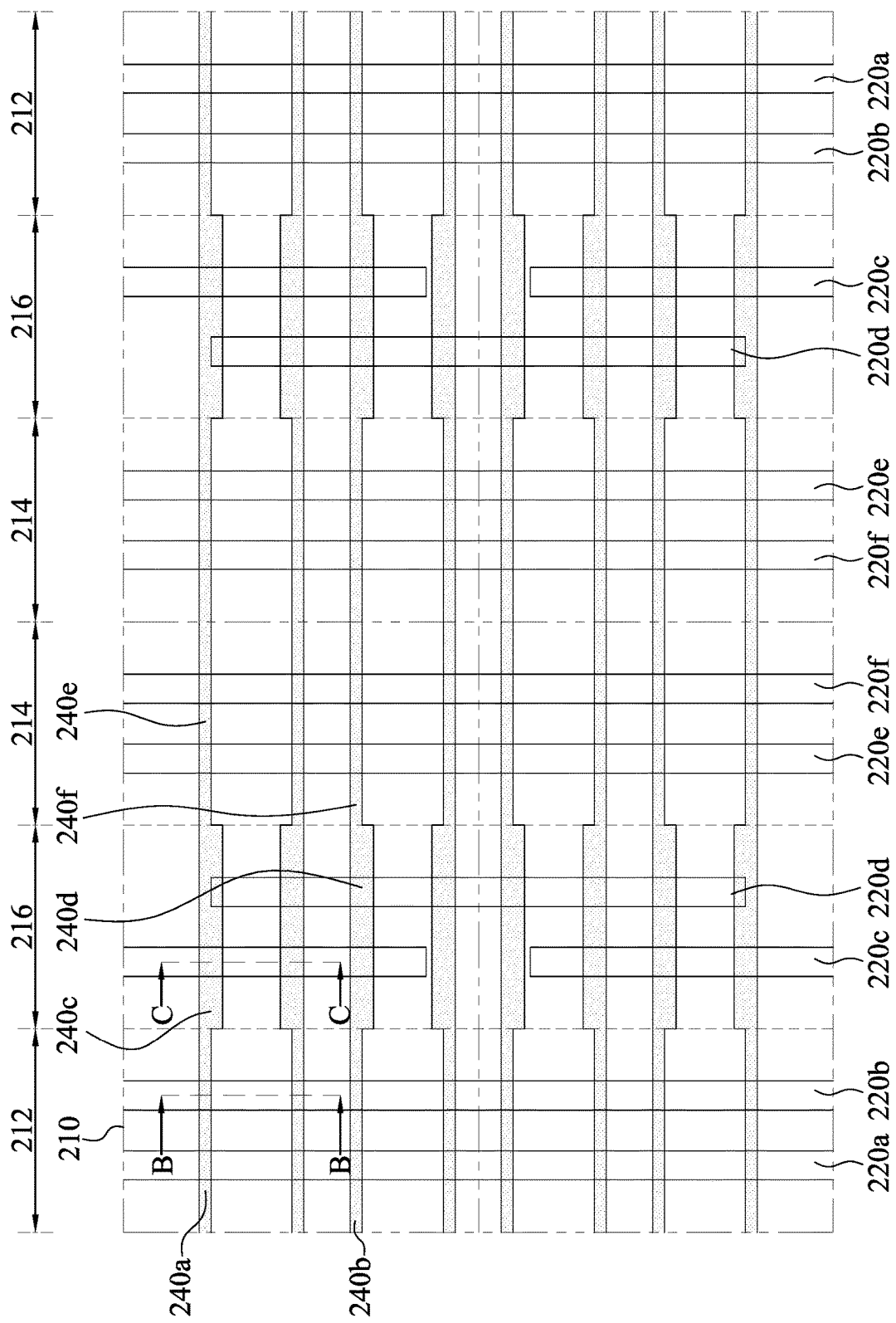
Figure 13C:
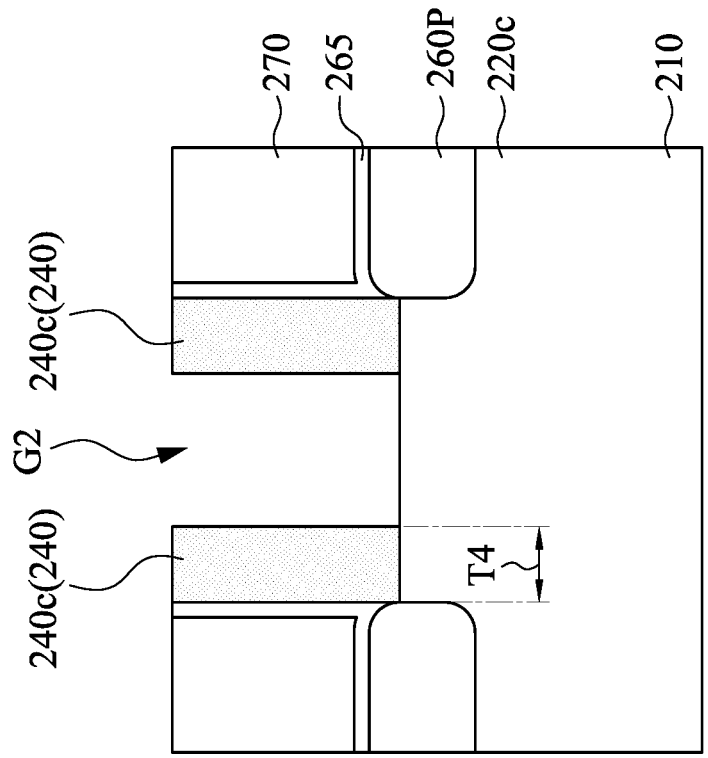
Figure 13B:
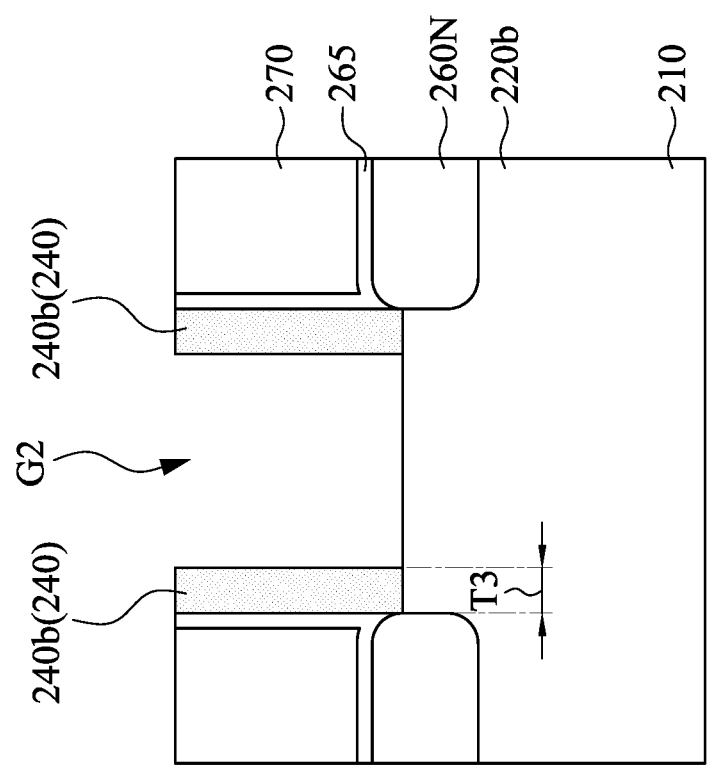

Reference is made to FIGS. 13A to 13C, in which FIG. 13B is a cross-sectional view along line B-B of FIG. 13A, and FIG. 13C is a cross-sectional view along line C-C of FIG. 13A. The gate dielectric layer 232 exposed by the gate trench G2 over the semiconductor fin 220b is removed, and the gate spacers 240 over the semiconductor fins 220b and 220c are thinned. In greater detail, the gate dielectric layer 232 over the semiconductor fins 220c and 220d within the N-well regions 216 are removed. On the other hand, the gate spacers 240 over the semiconductor fins 220a-220f within either the P-well regions 212, 214 or the N-well region 216 are thinned in this step. In some embodiments, the gate dielectric layer 232 can be removed by suitable process, such as etching. For example, the etchant for etching the gate dielectric layer 232 may be HF In some embodiments, the etchant used in the process of FIGS. 13A to 13C is similar or the same as the etchant used in the process of FIGS. 11A to 11C.

The resulting structures of the etching process are shown in FIGS. 13A to 13C. In FIG. 13A, the etched gate spacers 240 over the semiconductor fins 220a, 220b, 220c, 220d, 220e, 220f are referred to as gate spacers 240a, 240b, 240c, 240d, 240e, 240f, as labeled in FIGS. 2A to 2D.

In FIG. 11B, during etching the gate dielectric layer 232 over the semiconductor fin 220c (see FIG. 12C), the gate spacers 240b may also be etched by some amounts using the same etchant, because the gate spacers 240b are exposed to the etchant of the etching process. For example, the gate spacers 240b in FIG. 12B may have thickness T2, and the etched gate spacers 240b in FIG. 13B may have thickness T3. In some embodiments, the thickness T3 is lower than the thickness T2. The difference between thicknesses T3 and T2 is the thickness loss during the etching process described in FIGS. 13A to 13C. In some embodiments, the thickness loss (e.g., T2-T3) is in a range from about 0.5 nm to about 3 nm. In some embodiments, the thickness loss of the gate spacer 240b during the etching process of FIGS. 11A to 11C has a first value (e.g., T1-T2), and the thickness loss of the gate spacer 240b during the etching process of FIGS. 13A to 13C has a second value, in which the first value is greater than the second value. For example, the ratio of the first value to the second value is in a range from about 2:1 to about 4:1. That is, gate spacers 240b are etched by more amounts in the etching process of FIGS. 11A to 11C than in the etching process of FIGS. 13A to 13C. This is because the etching process of FIGS. 11A to 11C is used to generate thickness difference between the gate spacers 240b and 240c. In some embodiments, the duration of the etching process of the etching process of FIGS. 11A to 11C may be longer than the duration of the etching process of the etching process of FIGS. 13A to 13C, so as to etch more amounts of the gate spacers 240b in the etching process of FIGS. 11A to 11C.

In FIG. 11C, during etching the gate dielectric layer 232, the gate spacers 240c may also be etched by some amounts using the same etchant. For example, the gate spacers 240c may have original thickness T1 (see FIG. 12C), and the etched gate spacers 240c may have thickness T4. In some embodiments, the thickness T4 is lower than the thickness T1. The difference between thicknesses T1 and T4 is the thickness loss during the etching process described in FIGS. 13A to 13C. In some embodiments, the thickness loss (e.g., T1-T4) is in a range from about 0.5 nm to about 3 nm.

In some embodiments, the thickness T3 of the gate spacers 240b is in a range from about 0.5 nm to about 3 nm. If the thickness T3 is too low (e.g., much lower than 0.5 nm), the gate spacers 240b cannot provide sufficient isolation to the gate structure formed in later steps (e.g., the gate structure 230b of FIGS. 16A to 16C). In some embodiments, the ratio of thickness T4 to thickness is in a range from about 1 to about 4. If the ratio is too high, it indicate the gate spacers 240b may be too thin and cannot provide sufficient isolation. If the ratio is too low, it indicate the gate spacers 240b may be too thick and cannot provide sufficient difference from the gate spacers 240c.

Figure 14B:
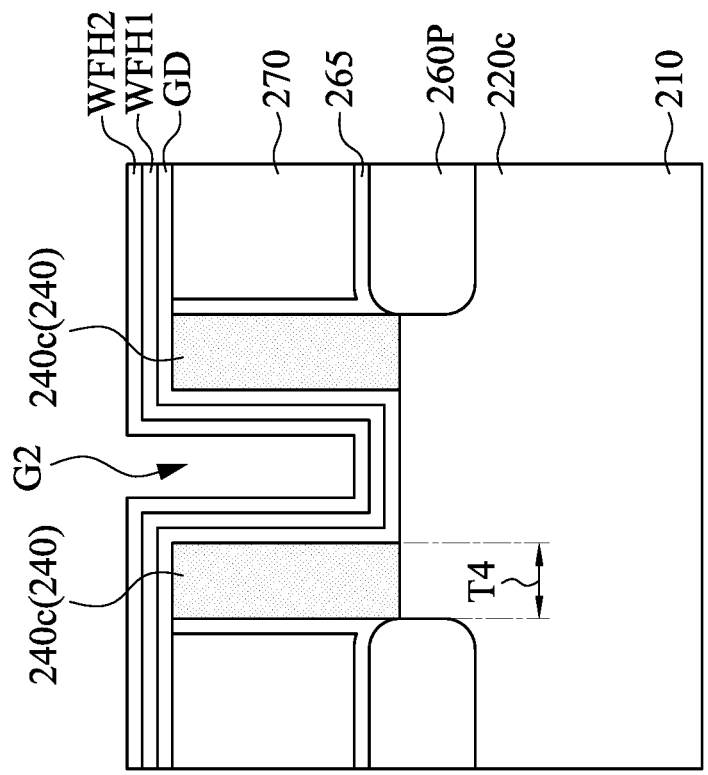
Figure 14A:
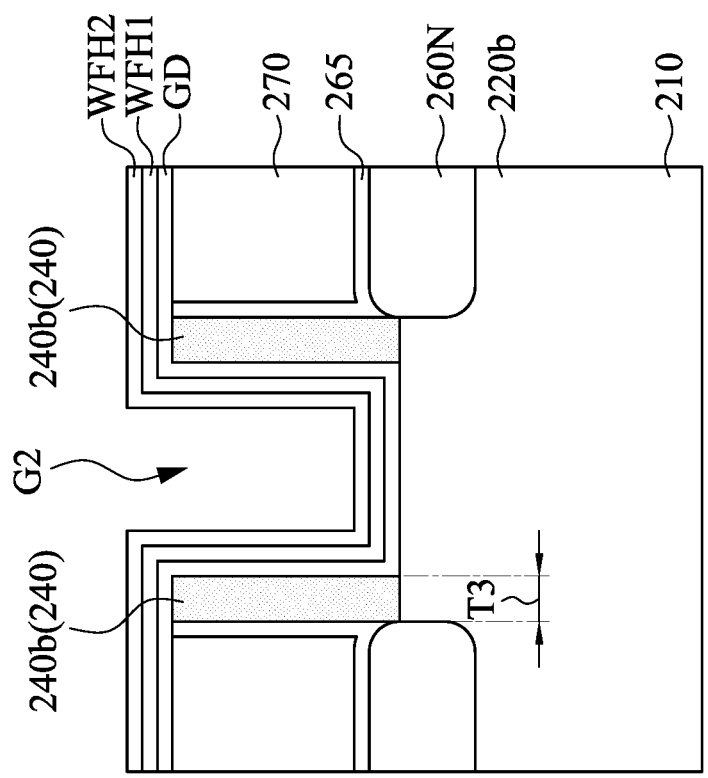

Reference is made to FIGS. 14A and 14B, in which FIGS. 14A and 14B follow the cross-sections of FIGS. 13B and 13C. A gate dielectric layer GD, a work function metal layer WFM1, a work function metal layer WFM2 are formed over the substrate 210 and fill the gate trenches G2 and G1. The gate dielectric layers GD may be formed by a deposition processes, such as chemical vapor deposition (CVD), physical vapor deposition (PVD), atomic layer deposition (ALD), plasma enhanced CVD (PECVD) or other suitable techniques. The work function metal layers WFM1 and WFM2 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

Figure 15B:
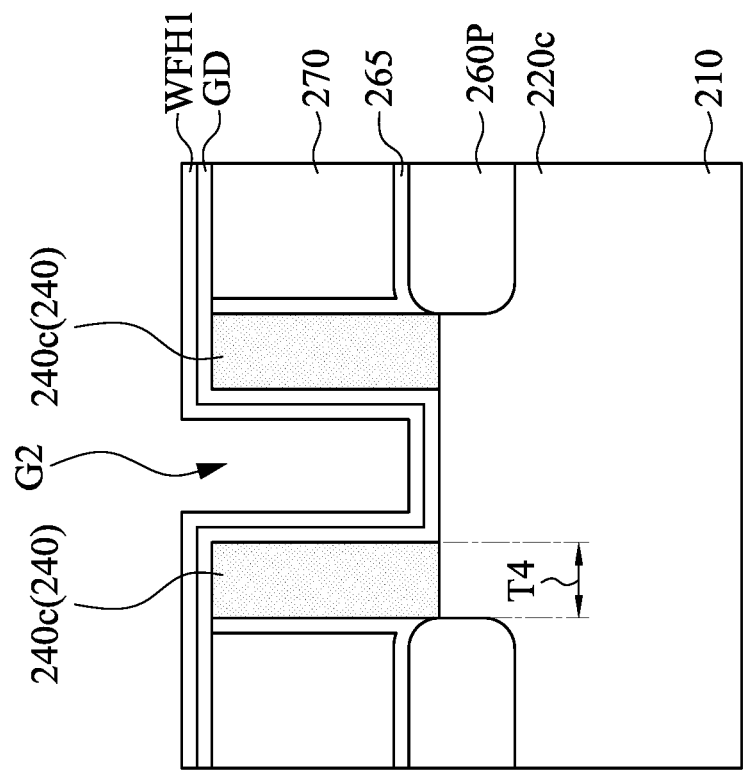
Figure 15A:
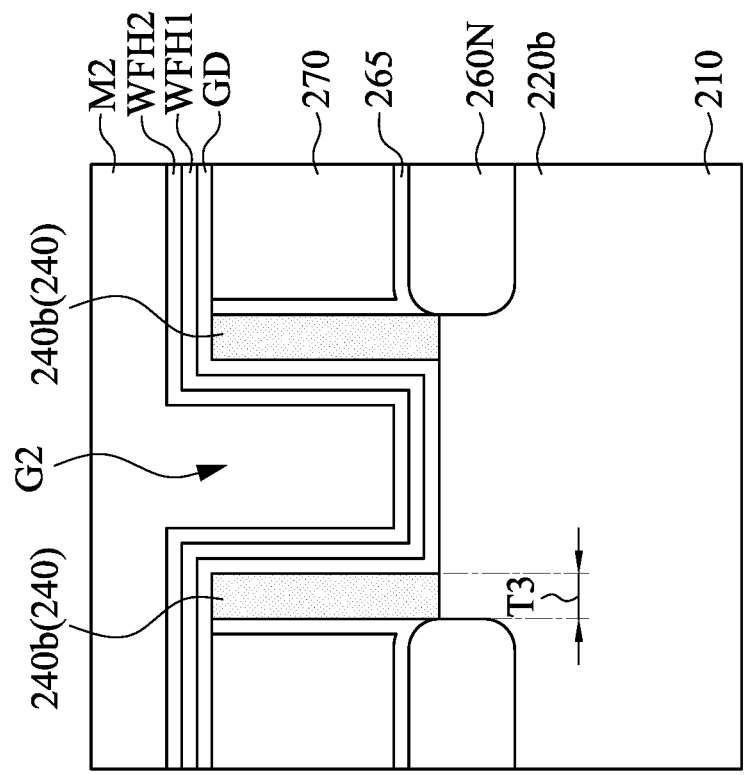

Reference is made to FIGS. 15A and 15B, in which FIGS. 15A and 15B follow the cross-sections of FIGS. 14A and 14B. A mask layer M2 is formed over the substrate 210, in which the mask layer M2 covers the semiconductor fin 220b (e.g., P-well regions 212), and does not cover the semiconductor fin 220c (e.g., N-well regions 216) Then, the work function metal layer WFM2 over the semiconductor fin 220c (see FIG. 14B) is removed. The work function metal layer WFM2 over the semiconductor fin 220c can be removed by suitable etching process, such as dry etching or wet etching.

Figure 16A:
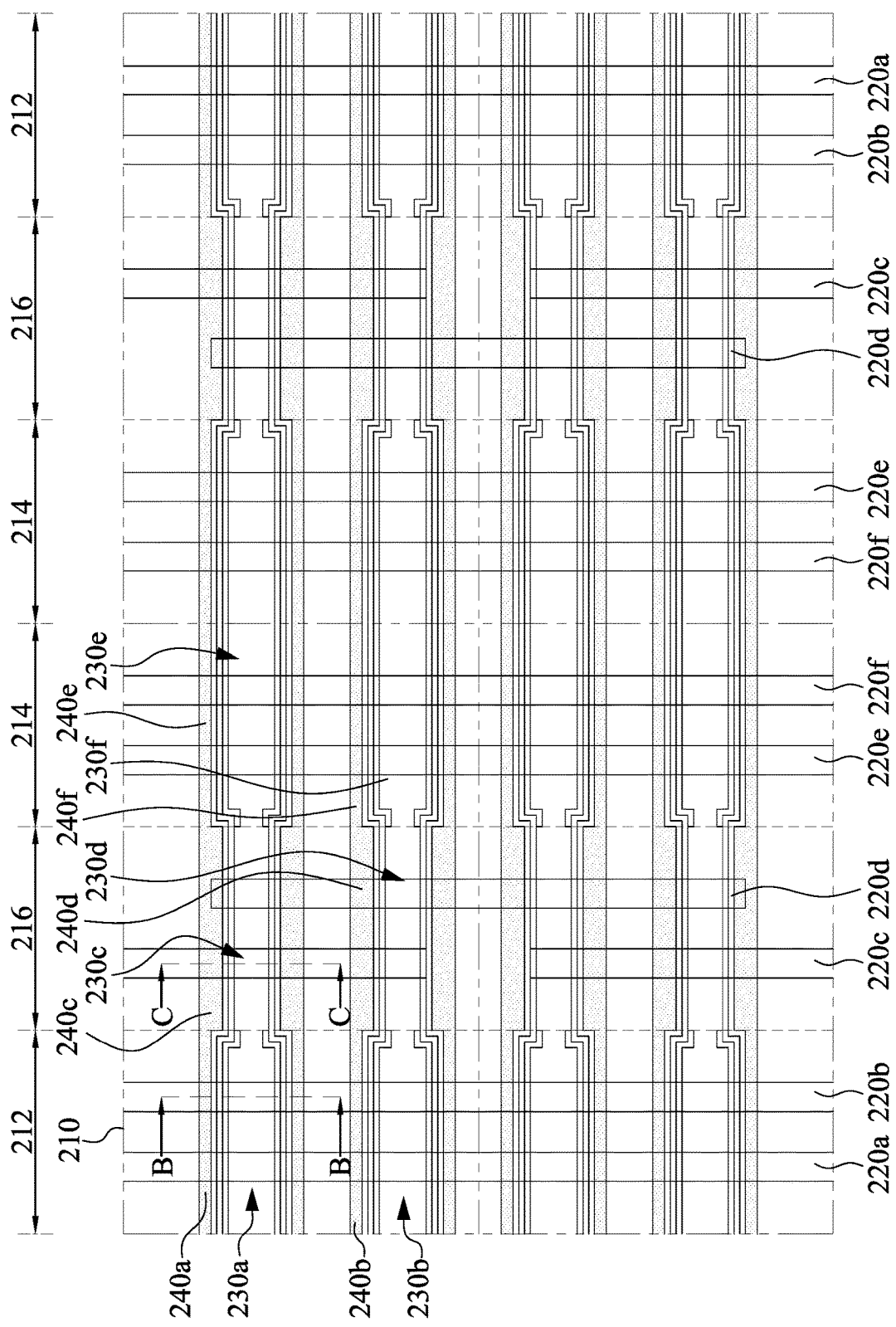
Figure 16C:
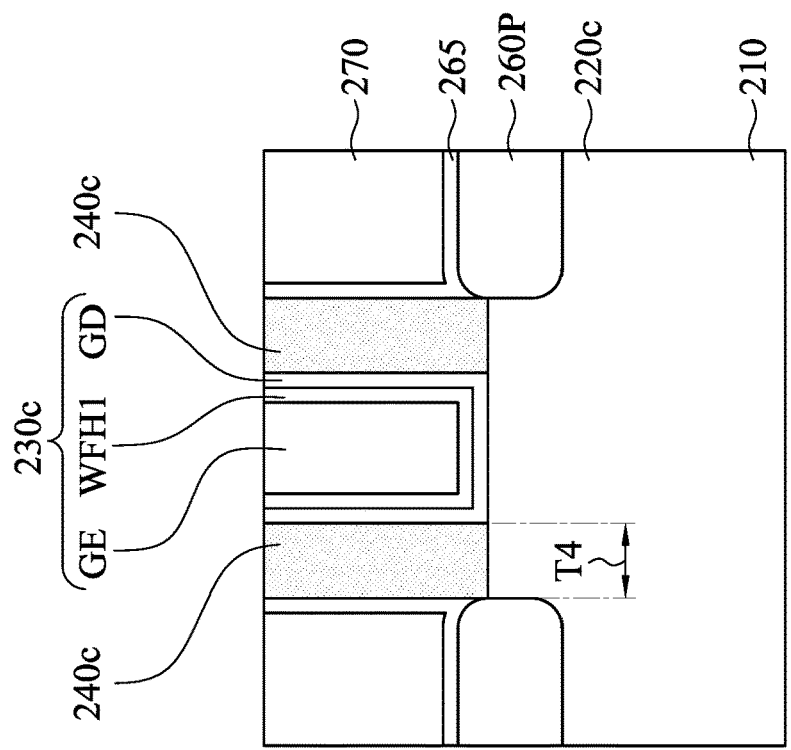
Figure 16B:
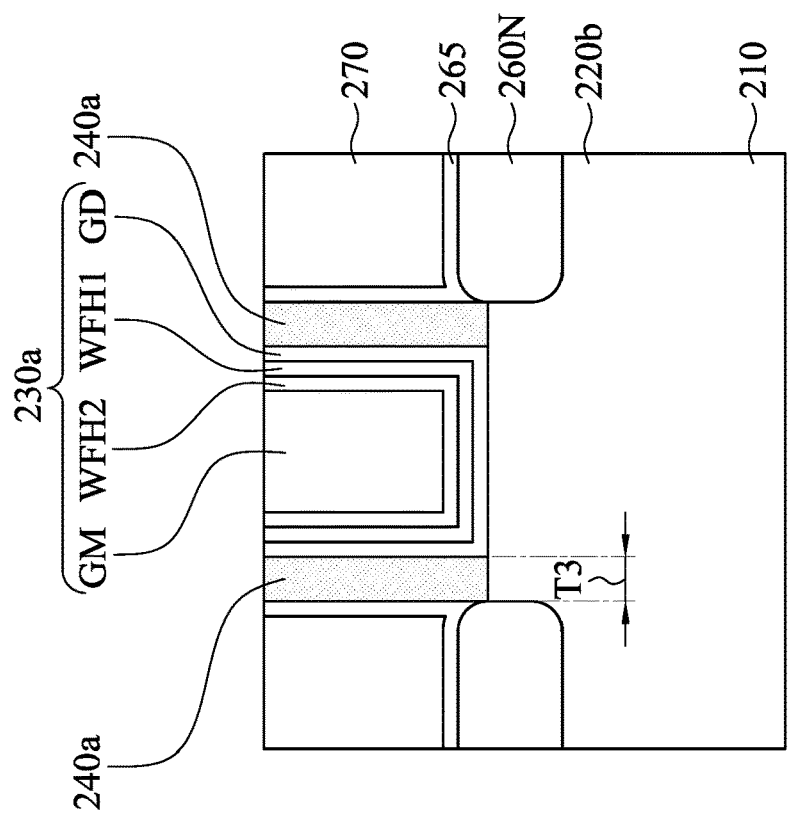

Reference is made to FIGS. 16A to 16C, in which FIG. 16B is a cross-sectional view along line B-B of FIG. 16A, and FIG. 16C is a cross-sectional view along line C-C of FIG. 16A. The mask layer M2 is removed. A gate metal GM is formed over the substrate 210, followed by a CMP process to remove excessive gate metal GM, work function metal layer WFM2, work function metal layer WFM1, and the gate dielectric layer GD until top surfaces of the ILD layer 270 are exposed. The resulting structures are shown in FIGS. 16A to 16C, in which a plurality of gate structures 230a, 230b, 230c, 230d, 230e, 230f are formed. In greater detail, the gate structures 230a, 230b, 230c, 230d, 230e, 230f are respectively between the corresponding gate spacers 240a, 240b, 240c, 240d, 240e, 240f, as shown in FIG. 16A. It is noted that the gate structures 230b, 230e, 230f and the gate spacers 240b, 240e, 240f have similar or the same structures as the gate structure 230a and the gate spacers 240a described in FIG. 16B, and the gate structures 230d and the gate spacers 240d have similar or the same structures as the gate structure 230c and the gate spacers 240c described in FIG. 16B.

Figure 17:
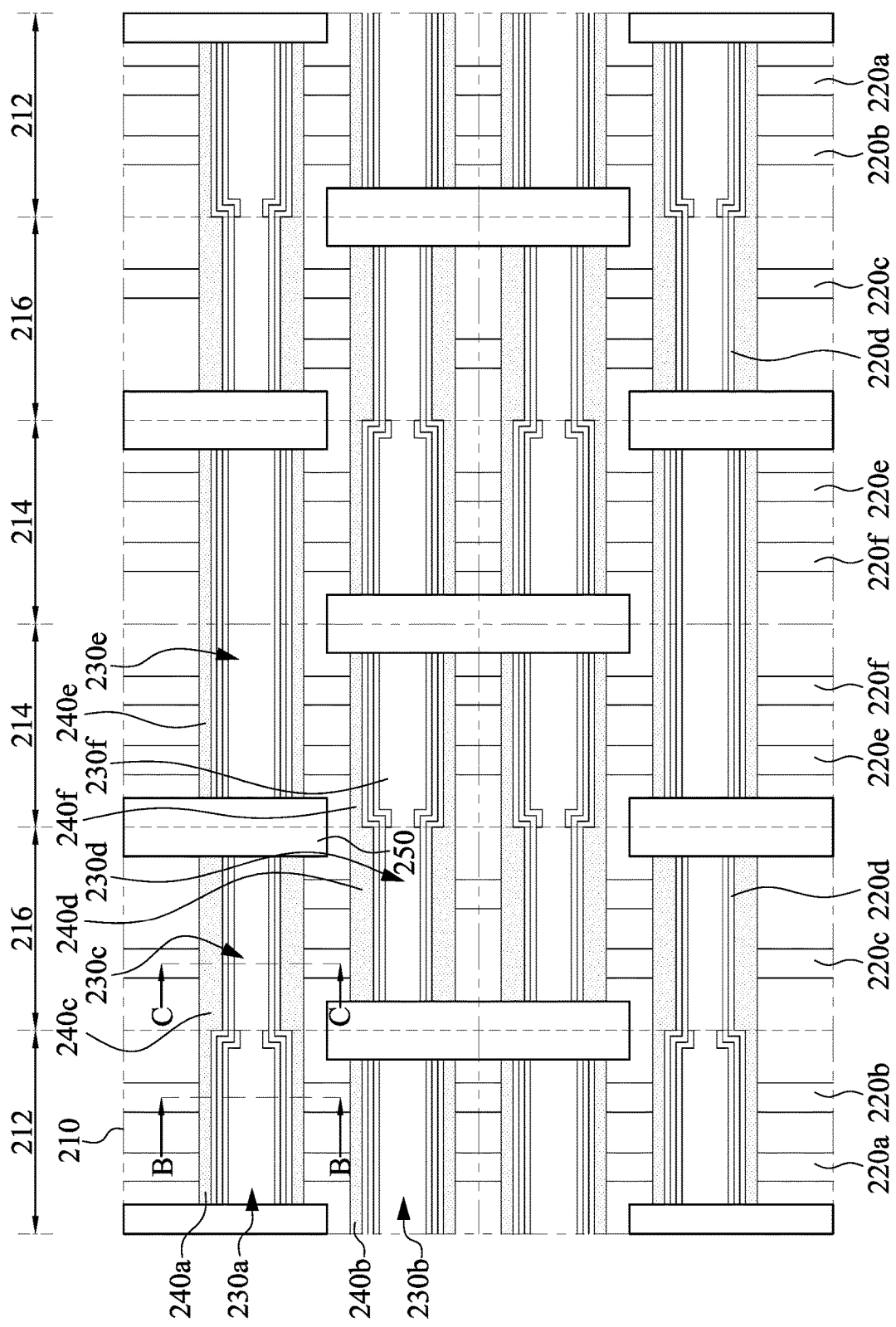

Reference is made to FIG. 17. A plurality of isolation structures 250 are formed over the substrate 210. In greater detail, in memory cell 200a, an isolation structure 250 is formed between and contacts the gate structures 230c and 230e, so as to electrically isolate the gate structures 230c and 230e. On the other hand, an isolation structure 250 is formed between and contacts the gate structures 230b and 230d, so as to electrically isolate the gate structures 230b and 230d. Generally, the isolation structures 250 are formed along a border of the P-well regions 212, 214 and the N-well region 216. The isolation structures 250 may be formed by, for example, forming a photoresist layer over the substrate 210, patterning the photoresist layer to form openings that expose portions of the gate structures 230a-230f, etching the exposed portions of the gate structures 230a-230f to form recesses, removing the photoresist layer, depositing a dielectric material over the substrate 210 and filling the recesses, followed by a CMP process until the top surfaces of the ILD layer 270 are exposed. In some embodiments, the isolation structures 250 are flowable dielectric material that can be deposited using a flowable CVD (FCVD). In some embodiments, the flowable isolation structures 250 may include a flowable oxide such as a flowable silicon oxide. The flowable isolation structures 250 is formed by using a spin on dielectric (SOD) such as a silicate, a siloxane, a methyl SilsesQuioxane (MSQ), a hydrogen SisesQuioxane (HSQ), an MSQ/HSQ, a perhydrosilazane (TCPS) or a perhydropolysilazane (PSZ). Alternatively, the flowable isolation structures 250 can be formed by using a low temperature plasma chemical vapor deposition.

Due to the scaling down of transistors, device variations and leakage are increasing sharply. As the need for low power systems grows, the supply voltage (VDD) has been scaled down to reduce both dynamic and leakage power. The operation of the SRAM at lower supply voltage becomes very challenging. The minimum operating voltage, $V_{min}$, needs to be satisfied otherwise will cause write failure, red disturb failure, access failure or retention failure. In the present disclosure, an etching process is performed to reduce thicknesses of gate spacers of an NMOS device over a P-well region, and therefore creates a wider deposition window for metal gate structure, which in turn will increase the volume of metal gate structure and will also lower the $V_{min}$ of the NMOS device. Accordingly, the device performance can be improved. However, if the gate structures the N-well regions and P-well regions have the same thickness, the $V_{min}$ of the NMOS device in the P-well region may be about 73% of the desired value. That is, the present disclosure can improve the $V_{min}$ of the NMOS device by more than 25%.

FIGS. 18A to 19B illustrate a method in various stages of fabricating a memory device in accordance with some embodiments of the present disclosure.

Figure 18A:
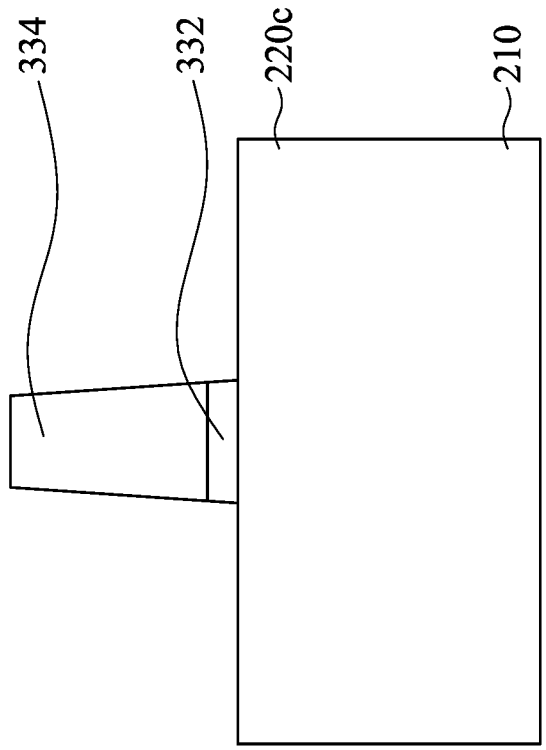
FIGS. 18A to 19B illustrate a method in various stages of fabricating a memory device in accordance with some embodiments of the present disclosure.
Figure 18B:
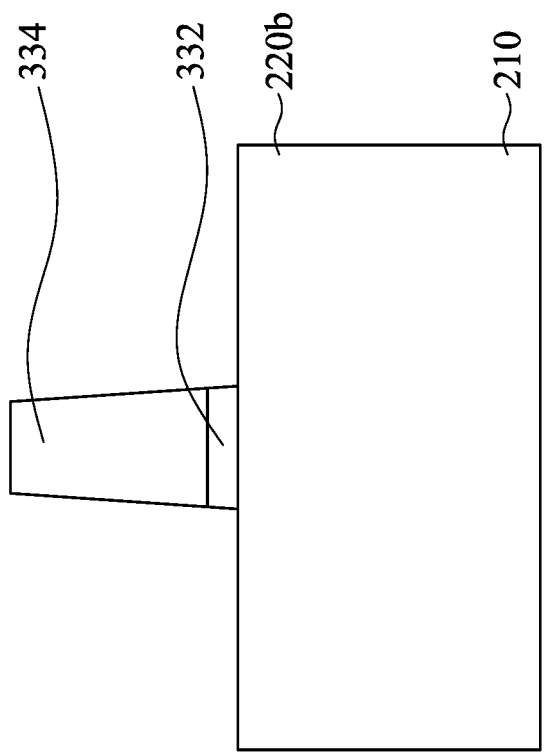

Reference is made to FIGS. 18A and 18B, in which FIGS. 18A and 18B are similar to FIGS. 5B and 5C, where a plurality of dielectric layers 332 and dummy gate layers 334 are formed respectively over the semiconductor fins 220a, 220c of the substrate 210. The material of the dielectric layers 332 and dummy gate layers 334 are similar or the same as the material of the dielectric layers 232 and dummy gate layers 234 described in FIGS. 5B and 5C. Different from the dielectric layers 232 and dummy gate layers 234 described in FIGS. 5B and 5C, the dielectric layers 332 and dummy gate layers 334 have tapered profile. For example, the dummy gate layers 334 have a width decreases when a distance from the substrate 210 increases. This is because when the etching process for etching the dummy gate layers 334 is a wet etching, etchant does not sufficiently etch the bottom of the dummy gate layers 334, which results in the tapered profile (or trapezoid profile) of the dummy gate layers 334.

Figure 19B:
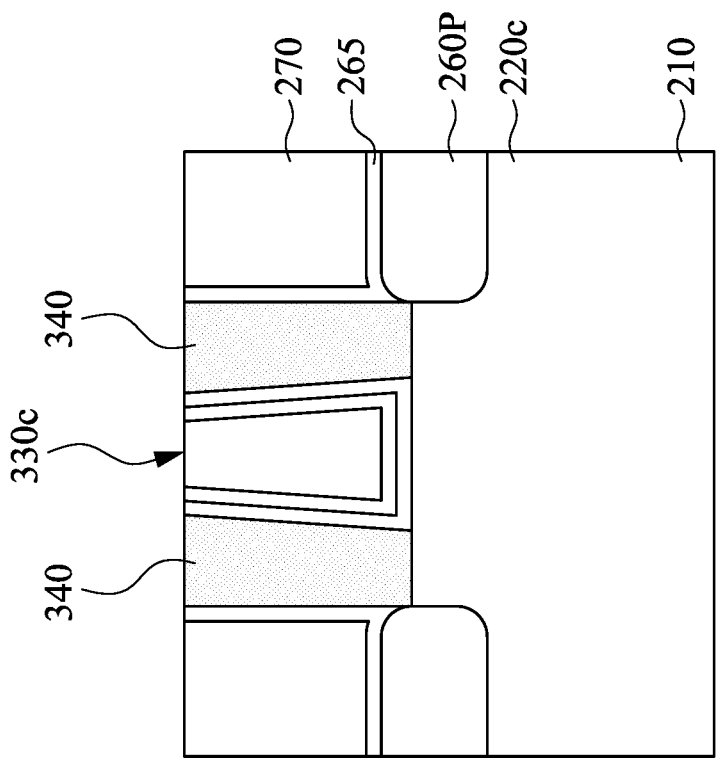
Figure 19A:
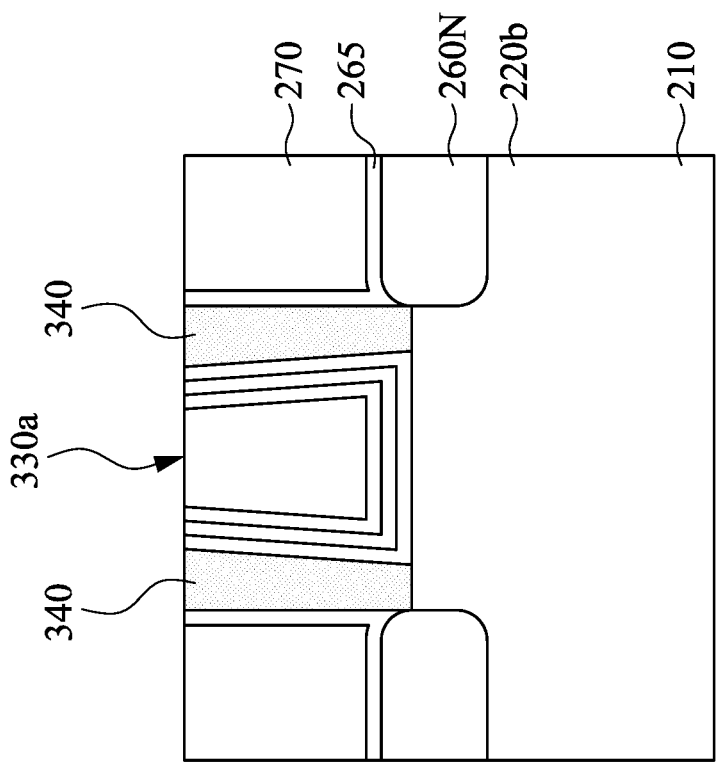

Reference is made to FIGS. 19A and 19B, in which FIGS. 19A and 19B are the resulting structures when the structures of FIGS. 18A and 18B undergo the processes described in FIGS. 6A to 17. The resulting structures of FIGS. 19A and 19B respectively include gate structures 330a, 330c, and gate spacers 340a, 340c. The gate structures 330a, 330c have similar or the same structures as the gate structures 230a, 230c in FIGS. 16B and 16C, and the gate spacers 340a, 340c have similar or the same structures as the gate spacers 340a, 340c in FIGS. 16B and 16C, and the relationships between the gate structures 2330a and the gate spacers 340a and between the gate structures 230c and the gate spacers 240c are substantially the same.

As described in FIGS. 18A and 18B, the dummy gate layers 334 have tapered profile (or trapezoid profile), and this results in that the gate structures 330a, 330c have tapered profile, as the gate structures 330a, 330c substantially inherit the profile of the dummy gate layers 334. For example, the gate structures 330a, 330c have widths decreases when a distance from the substrate 210 increases. Stated another way, the gate structures 330a, 330c have tapered profile (or trapezoid profile).

FIGS. 20A to 21B illustrate a method in various stages of fabricating a memory device in accordance with some embodiments of the present disclosure.

Figure 20B:
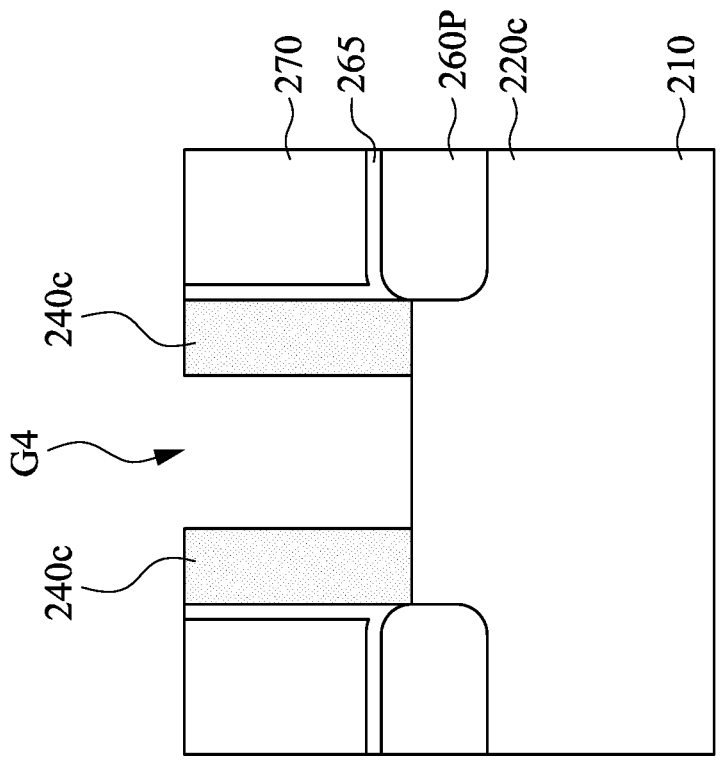
FIGS. 20A to 21B illustrate a method in various stages of fabricating a memory device in accordance with some embodiments of the present disclosure.
Figure 20A:
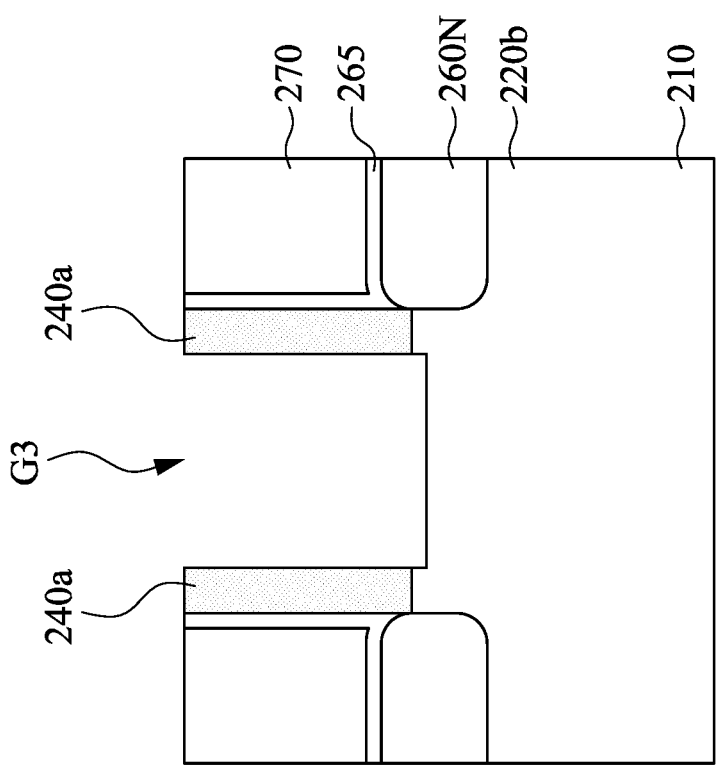

Reference is made to FIGS. 20A and 20B, in which FIGS. 20A and 20B are similar to FIGS. 13B and 13C, where the gate dielectric layer 232 over the semiconductor fin 220c is removed, and the gate spacers 240a, 240c are thinned. In FIG. 13B, because the gate dielectric layer 232 over the semiconductor fin 220b has been removed in FIG. 11B, and thus the top surface of the semiconductor fin 220b is exposed to the etching process of FIGS. 13B and 13C, and thus the semiconductor fin 220b may be etched by some amounts during the etching process of FIGS. 13B and 13C. The resulting structures are shown in FIGS. 20A and 20B, in which a gate trench G3 is formed between the gate spacers 240a, while the gate trench G3 is slightly into the semiconductor fin 220b. Stated another way, the exposed surface of the semiconductor fin 220b is lower than the bottommost surface of the gate spacers 240a. On the other hand, a gate trench G4 is formed between the gate spacers 240c in FIG. 20B. In some embodiments, the gate trench G3 in FIG. 20A is deeper than the gate trench G4 in FIG. 20B. This is because the etchant of the etching process would start from etching the gate dielectric layer 232 over the semiconductor fin 220b (see FIG. 12C), and the gate dielectric layer 232 can protect the semiconductor fin 220b from being etched.

Figure 21B:
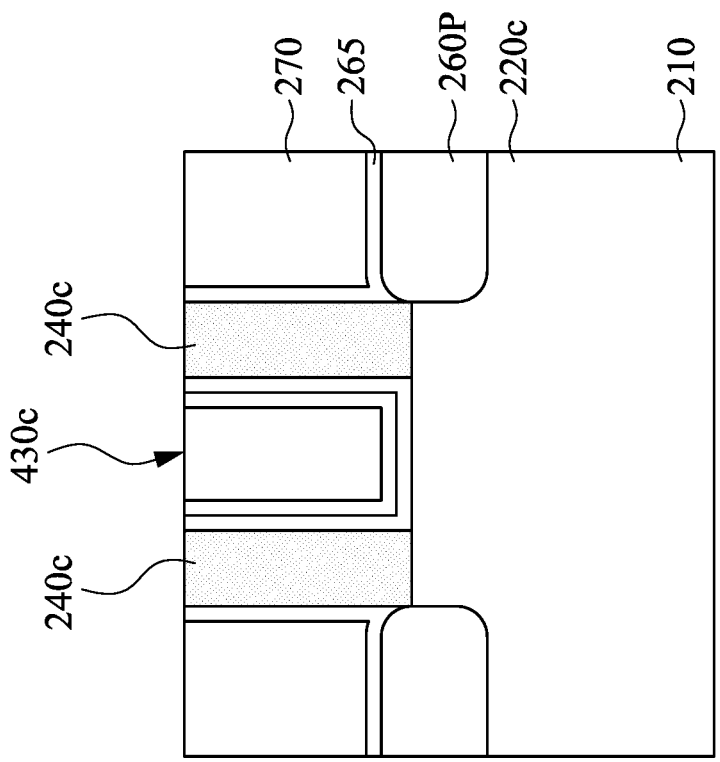
Figure 21A:
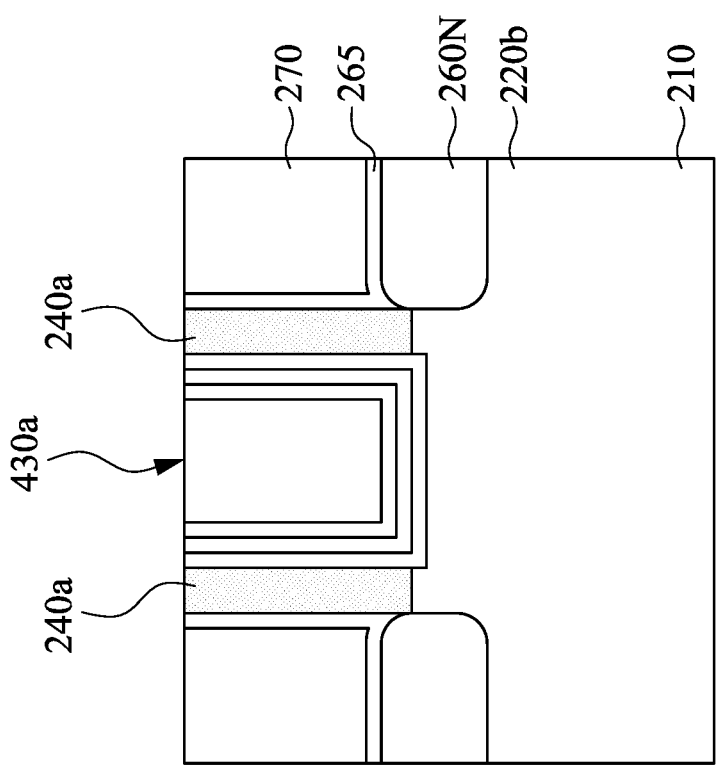

Reference is made to FIGS. 21A and 21B, in which FIGS. 21A and 21B are the resulting structures when the structures of FIGS. 20A and 20B undergo the processes described in FIGS. 14A to 17. The resulting structures of FIGS. 21A and 21B respectively include gate structures 430a, 430c. The gate structures 430a, 430c have similar or the same structures as the gate structures 230a, 230c in FIGS. 16B and 16C. In some embodiments, the bottom surface of the gate structure 430 is lower than the bottom surface of the gate spacers 240a. Moreover, the bottom surface of the gate structure 430a in FIG. 21A is lower than the bottom surface of the gate structure 430c in FIG. 21B. In some embodiments, a bottom portion of the gate structure 430a is embedded in the semiconductor fin 220b, while the gate structure 430c is not embedded in the semiconductor fin 220c.

Figure 22A:
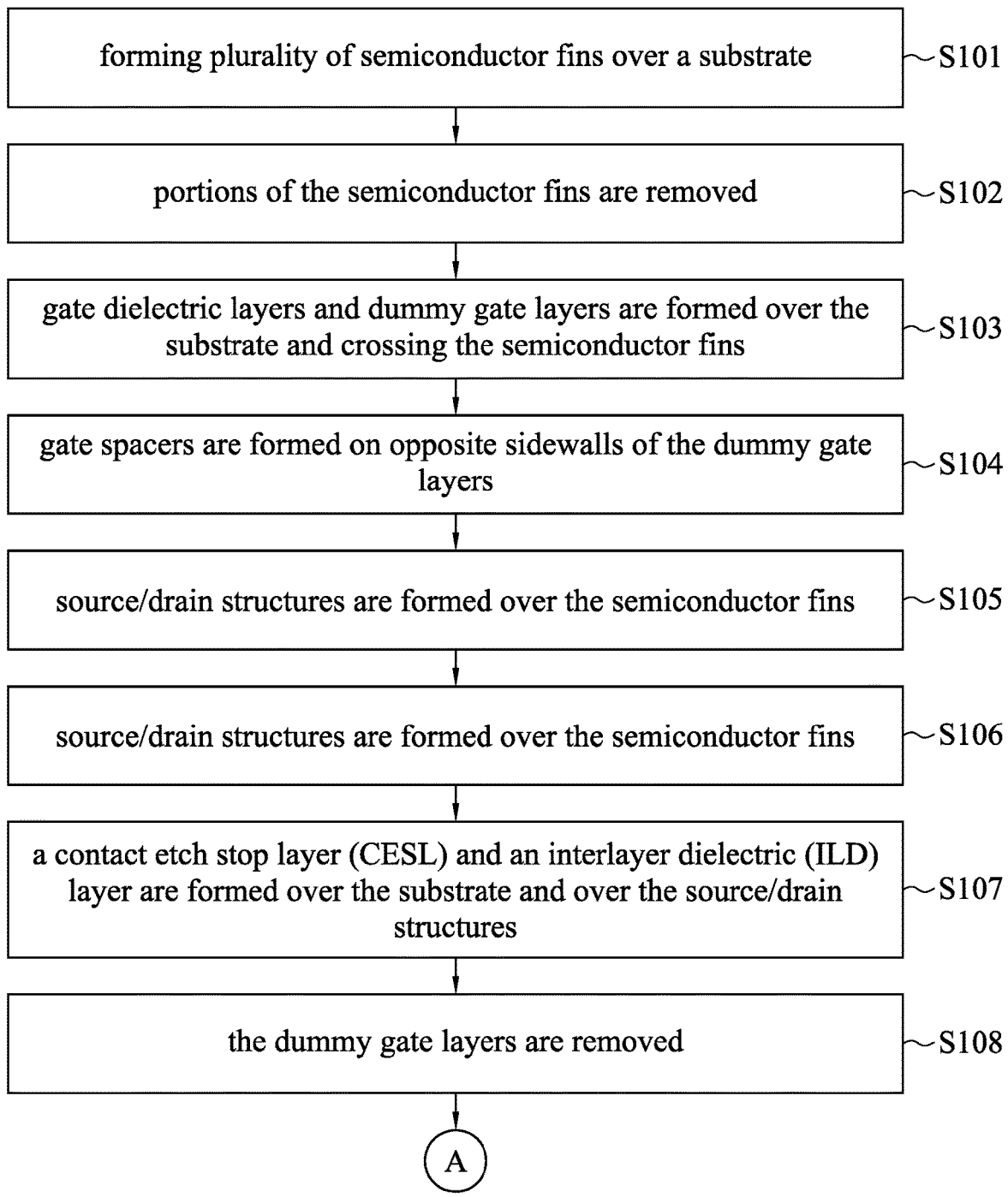
FIGS. 22A and 22B are a method for forming a memory device in accordance with some embodiments of the present disclosure.
Figure 22B:
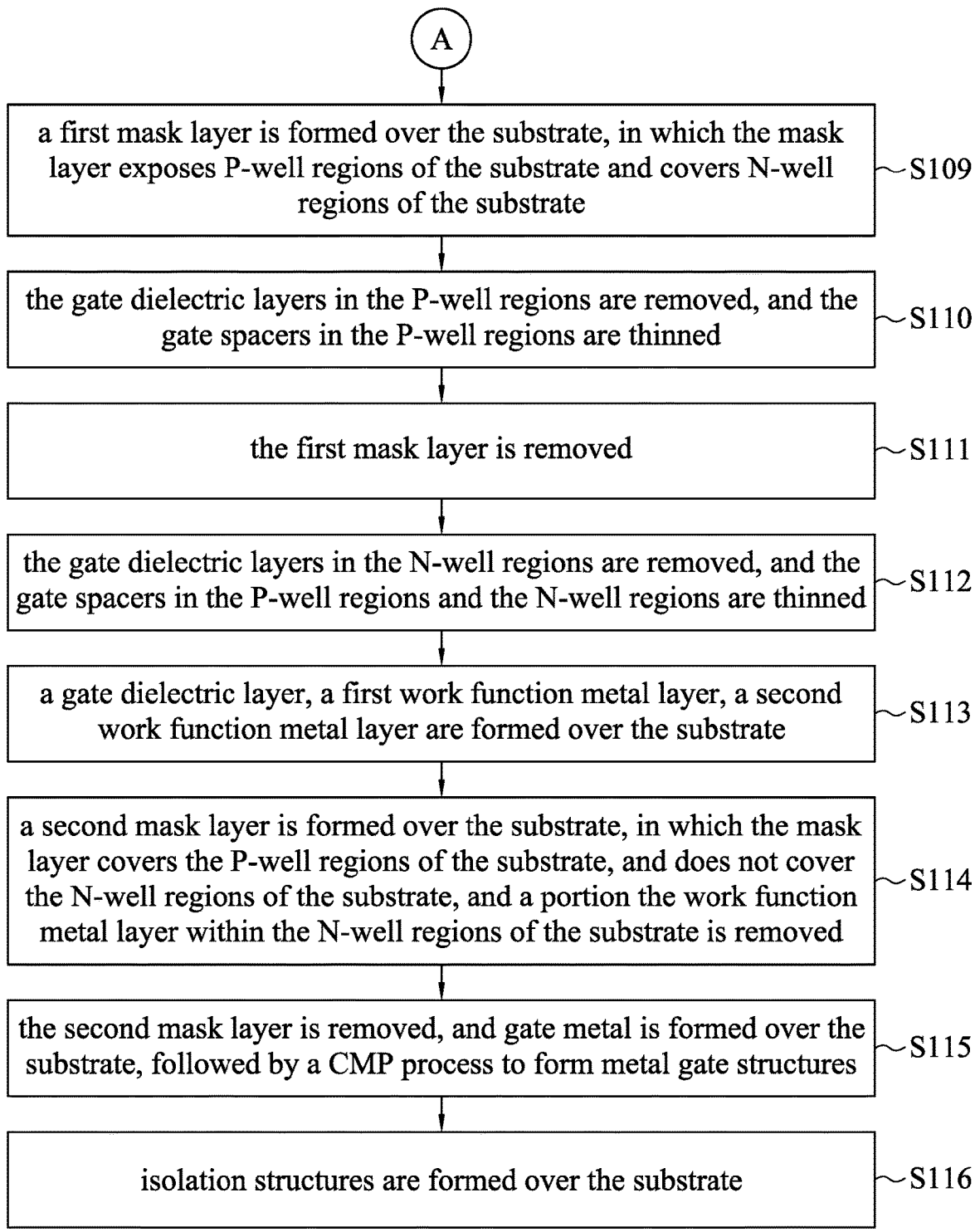

FIGS. 22A to 22B illustrate a method 1000 of manufacturing in accordance with some embodiments of the present disclosure. Although the method 1000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, forming plurality of semiconductor fins over a substrate. FIG. 3 illustrates a schematic view of some embodiments corresponding to act in block S101.

At block S102, portions of the semiconductor fins are removed. FIGS. 4A to 4C illustrate schematic views of some embodiments corresponding to act in block S102.

At block S103, gate dielectric layers and dummy gate layers are formed over the substrate and crossing the semiconductor fins. FIGS. 5A to 5C illustrate schematic views of some embodiments corresponding to act in block S103.

At block S104, gate spacers are formed on opposite sidewalls of the dummy gate layers. FIGS. 6A to 6C illustrate schematic views of some embodiments corresponding to act in block S104.

At block S105, source/drain structures are formed over the semiconductor fins. FIGS. 7A to 7B illustrate schematic views of some embodiments corresponding to act in block S105.

At block S106, source/drain structures are formed over the semiconductor fins. FIGS. 7A to 7B illustrate schematic views of some embodiments corresponding to act in block S106.

At block S107, a contact etch stop layer (CESL) and an interlayer dielectric (ILD) layer are formed over the substrate and over the source/drain structures. FIGS. 8A to 8B illustrate schematic views of some embodiments corresponding to act in block S107.

At block S108, the dummy gate layers are removed. FIGS. 9A to 9C illustrate schematic views of some embodiments corresponding to act in block S108.

At block S109, a first mask layer is formed over the substrate, in which the mask layer exposes P-well regions of the substrate and covers N-well regions of the substrate. FIGS. 10A to 10C illustrate schematic views of some embodiments corresponding to act in block S109.

At block S110, the gate dielectric layers in the P-well regions are removed, and the gate spacers in the P-well regions are thinned. FIGS. 11A to 11C illustrate schematic views of some embodiments corresponding to act in block S110.

At block S111, the first mask layer is removed. FIGS. 12A to 12C illustrate schematic views of some embodiments corresponding to act in block S111.

At block S112, the gate dielectric layers in the N-well regions are removed, and the gate spacers in the P-well regions and the N-well regions are thinned. FIGS. 13A to 13C illustrate schematic views of some embodiments corresponding to act in block S112.

At block S113, a gate dielectric layer, a first work function metal layer, a second work function metal layer are formed over the substrate. FIGS. 14A to 14B illustrate schematic views of some embodiments corresponding to act in block S113.

At block S114, a second mask layer is formed over the substrate, in which the mask layer covers the P-well regions of the substrate, and does not cover the N-well regions of the substrate, and a portion the work function metal layer within the N-well regions of the substrate is removed. FIGS. 15A to 15B illustrate schematic views of some embodiments corresponding to act in block S114.

At block S115, the second mask layer is removed, and gate metal is formed over the substrate, followed by a CMP process to form metal gate structures. FIGS. 16A to 16C illustrate schematic views of some embodiments corresponding to act in block S115.

At block S116, isolation structures are formed over the substrate. FIG. 17 illustrates a schematic view of some embodiments corresponding to act in block S115.

Figure 23:
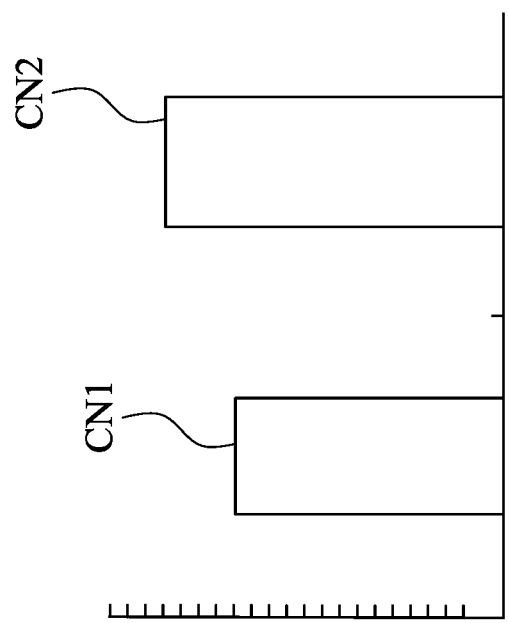
FIG. 23 illustrates simulation results of reduction of memory device in accordance with some embodiments of the present disclosure.

FIG. 23 illustrates simulation results of memory devices in accordance with some embodiments of the present disclosure. Conditions CN1 and CN2 illustrate simulation results of different memory devices. The difference between Conditions CN1 and CN2 is that Condition CN1 is a simulation result of a memory device having gate structures (within different regions) having the same width, while Condition CN2 is a simulation result of a memory device having gate structures (within different regions) having different width (such as the memory device discussed in FIGS. 1 to 17). The height of the bar indicates how Vmin is close to a desired Vmin, in which the topmost point of the vertical axis indicates the desired Vmin. Comparing Condition CN1 with Condition CN2, it is clear that Condition CN2 is close to the desired Vmin.

Based on the above discussion, it can be seen that the present disclosure offers advantages. It is understood, however, that other embodiments may offer additional advantages, and not all advantages are necessarily disclosed herein, and that no particular advantages is required for all embodiments. Due to the scaling down of transistors, device variations and leakage are increasing sharply. As the need for low power systems grows, the supply voltage (VDD) has been scaled down to reduce both dynamic and leakage power. The operation of the SRAM at lower supply voltage becomes very challenging. The minimum operating voltage, Vmin, needs to be satisfied otherwise will cause write failure, red disturb failure, access failure or retention failure. In the present disclosure, an etching process is performed to reduce thicknesses of gate spacers of an NMOS device over a P-well region, and therefore creates a wider deposition window for metal gate structure, which in turn will increase the volume of metal gate structure and will also lower the Vmin of the NMOS device. Accordingly, the device performance can be improved. However, if the gate structures the N-well regions and P-well regions have the same thickness, the Vmin of the NMOS device in the P-well region may be about 73% of the desired value. That is, the present disclosure can improve the Vmin of the NMOS device by more than 25%.

In some embodiments of the present disclosure, a memory device includes a substrate, first semiconductor fin, second semiconductor fin, first gate structure, second gate structure, first gate spacer, and a second gate spacer. The substrate has a P-well region and an N-well region. The first semiconductor fin is over the P-well region of the substrate. The second semiconductor fin is over the N-well region of the substrate. The first gate structure is over the P-well region of the substrate and crosses the first semiconductor fin. The second gate structure is over the N-well region of the substrate and crosses the second semiconductor fin, the first gate structure extends continuously from the second gate structure, in which in a top view of the memory device, a width of the first gate structure is greater than a width of the second gate structure. The first gate spacer is on a sidewall of the first gate structure. The second gate spacer extends continuously from the first gate spacer and on a sidewall of the second gate structure, in which in the top view of the memory device, a width of the first gate spacer is less than a width of the second gate spacer.

In some embodiments of the present disclosure, a memory device includes a substrate, an isolation structure, a first gate structure, and a second gate structure. The substrate has a P-well region and an N-well region. The isolation structure extends along a border between the P-well region and the N-well region. The first gate structure extends from a first side of the isolation structure within the P-well region. The second gate structure extends from a second side of the isolation structure within the N-well region, wherein when viewed from above, an interface between the first gate structure and the isolation structure is larger than an interface between the second gate structure and the isolation structure.

In some embodiments of the present disclosure, a method includes forming a first semiconductor fin and a second semiconductor fin over a substrate; forming a first dummy gate structure over the first semiconductor fin and a second dummy gate structure over the second semiconductor fin; forming first gate spacers on either side of the first dummy gate structure and second gate spacers on either side of the second dummy gate structure; etching the first and second dummy gate structures to expose inner sidewalls of the first and second gate spacers; after etching the first and second dummy gate structures, forming a patterned mask covering the second gate spacers, while leaving the inner sidewalls of the first gate spacers exposed; with the patterned mask in place, performing a first etching process on the exposed inner sidewalls of the first gate spacers to thin the first gate spacers; after the first etching process, removing the patterned mask; and forming a first metal gate structure between the first gate spacers, and a second metal gate structure between the second gate spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first semiconductor fin and a second semiconductor fin over a substrate;
   forming a first dummy gate structure over the first semiconductor fin and a second dummy gate structure over the second semiconductor fin;

forming first gate spacers on either side of the first dummy gate structure and second gate spacers on either side of the second dummy gate structure;

etching the first and second dummy gate structures to expose inner sidewalls of the first and second gate spacers;

after etching the first and second dummy gate structures, forming a patterned mask covering the second gate spacers, while leaving the inner sidewalls of the first gate spacers exposed;

with the patterned mask in place, performing a first etching process on the exposed inner sidewalls of the first gate spacers to thin the first gate spacers;

after the first etching process, removing the patterned mask; and forming a first metal gate structure between the first gate spacers, and a second metal gate structure between the second gate spacers.

2. The method of claim 1, wherein the first etching process is performed such that a gate dielectric layer of the first dummy gate structure is removed, while a gate dielectric layer of the second dummy gate structure is protected by the patterned mask during the first etching process.

3. The method of claim 2, further comprising after removing the patterned mask, performing a second etching process to thin the first and second gate spacers.

4. The method of claim 3, wherein the gate dielectric layer of the second dummy gate structure is removed during second etching process.

5. The method of claim 3, wherein a duration of the first etching process is longer than a duration of the second etching process.

6. A method, comprising:

forming a first semiconductor fin and a second semiconductor fin over a substrate;

forming a dummy gate structure over the substrate, the dummy gate structure comprising a first portion crossing the first semiconductor fin and a second portion crossing the second semiconductor fin;

forming gate spacers on opposite sidewalls of the dummy gate structure, the gate spacers comprising a first portion on opposite sidewalls of the first portion of the dummy gate structure and a second portion on opposite sidewalls of the second portion of the dummy gate structure;

performing a first etching process to the first portion of the gate spacers, such that the first portion of the gate spacers are thinner than the second portion of the gate spacers;

performing a second etching process to thin the first and second portions of the gate spacers after the first etching process is completed; and forming a metal gate structure over the substrate, the metal gate structure comprising a first portion crossing the first semiconductor fin and a second portion crossing the second semiconductor fin.

7. The method of claim 6, further comprising removing the dummy gate structure prior to performing the first etching process.

8. The method of claim 6, further comprising:

forming a patterned mask covering the second portion of the gate spacers prior to performing the first etching process; and removing the patterned mask after the first etching process is completed.

9. The method of claim 6, wherein a duration of the first etching process is longer than a duration of the second etching process.

10. The method of claim 6, further comprising forming an isolation structure between the first and second portions of the metal gate structure.

11. The method of claim 6, further comprising forming source/drain structures over the first and second semiconductor fins and on opposite sides of the dummy gate structure prior to performing the first etching process.

12. The method of claim 6, wherein the first portion of the metal gate structure is wider than the second portion of the metal gate structure.

13. The method of claim 6, wherein the first portion of the dummy gate structure in connected to the second portion of the dummy gate structure from a top view.

14. A method, comprising:

forming a first semiconductor fin and a second semiconductor fin over a substrate;

forming a first dummy gate structure over the first semiconductor fin and a second dummy gate structure over the second semiconductor fin, the first dummy gate structure comprising a first gate dielectric and a first gate layer over the first gate dielectric, and the second dummy gate structure comprising a second gate dielectric and a second gate layer over the second gate dielectric;

forming first gate spacers on opposite sidewalls of the first dummy gate structure and second gate spacers on opposite sidewalls of the second dummy gate structure;

removing the first and second gate layers, while leaving the first and second gate dielectrics over the first and second semiconductor fins, respectively;

forming a patterned mask covering the second gate dielectric and the second gate spacers, while leaving the first gate dielectric and the first gate spacers exposed;

performing a first etching process to remove the first gate dielectric and thin the first gate spacers;

removing the patterned mask;

performing a second etching process to remove the second gate dielectric; and forming a first metal gate structure between the first gate spacers, and a second metal gate structure between the second gate spacers.

15. The method of claim 14, wherein the second etching process further thins the first and second gate spacers.

16. The method of claim 14, wherein the first metal gate structure is wider than the second metal gate structure.

17. The method of claim 14, wherein a duration of the first etching process is longer than a duration of the second etching process.

18. The method of claim 14, wherein an etchant of the first etching process and an etchant of the second etching process are the same.

19. The method of claim 14, wherein after the second etching process is completed, a top surface of the first semiconductor fin is lower than a top surface of the second semiconductor fin.

20. The method of claim 14, further comprising forming an isolation structure between the first metal gate structure and the second metal gate structure, wherein the isolation structure is in contact with the first metal gate structure and the second metal gate structure.

* * * * *